United States Patent
Mochizuki et al.

(10) Patent No.: US 9,423,678 B2
(45) Date of Patent: Aug. 23, 2016

(54) LIGHT EMITTING DEVICE, AND SUPER LUMINESCENT DIODE

(71) Applicant: Seiko Epson Corporation, Tokyo (JP)

(72) Inventors: Masamitsu Mochizuki, Fujimi (JP); Michifumi Nagawa, Shiojiri (JP)

(73) Assignee: Seiko Epson Corporation (JP)

( * ) Notice: Subject to any disclaimer, the term of this patent is extended or adjusted under 35 U.S.C. 154(b) by 194 days.

(21) Appl. No.: 14/159,111

(22) Filed: Jan. 20, 2014

(65) Prior Publication Data

US 2014/0204352 A1 Jul. 24, 2014

(30) Foreign Application Priority Data

Jan. 21, 2013 (JP) .................................. 2013-008094

(51) Int. Cl.
| | | |
|---|---|---|
| H01L 33/00 | (2010.01) | |
| G03B 21/20 | (2006.01) | |
| H01S 5/02 | (2006.01) | |
| H01S 5/028 | (2006.01) | |
| H01S 5/10 | (2006.01) | |
| H01L 33/10 | (2010.01) | |
| B82Y 20/00 | (2011.01) | |
| H01S 5/16 | (2006.01) | |
| H01S 5/343 | (2006.01) | |

(52) U.S. Cl.
CPC .............. *G03B 21/2033* (2013.01); *B82Y 20/00* (2013.01); *G03B 21/2066* (2013.01); *H01L 33/0045* (2013.01); *H01L 33/10* (2013.01); *H01S 5/0203* (2013.01); *H01S 5/028* (2013.01); *H01S 5/1003* (2013.01); *H01S 5/162* (2013.01); *H01S 5/101* (2013.01); *H01S 5/1071* (2013.01); *H01S 5/34326* (2013.01)

(58) Field of Classification Search
CPC . H01L 33/0045; H01L 33/10; G03B 21/2033
See application file for complete search history.

(56) References Cited

U.S. PATENT DOCUMENTS

| | | |
|---|---|---|
| 4,764,934 A | 8/1988 | Kwong et al. |
| 5,020,067 A | 5/1991 | Okada |
| 6,399,407 B1 * | 6/2002 | O'Brien ................ H01S 5/0614 257/94 |

(Continued)

FOREIGN PATENT DOCUMENTS

| | | |
|---|---|---|
| EP | 1276187 A2 | 1/2003 |
| JP | 2008-300700 A | 12/2008 |

(Continued)

OTHER PUBLICATIONS

Tateota et al., "A High-Power GaAlAs Superluminescent Diode with an Antireflective Window Structure", IEEE Journal of Quantum Electronics, vol. 27, No. 6, pp. 1568-1573 (Jun. 1991).

(Continued)

*Primary Examiner* — Duy T Nguyen

(74) *Attorney, Agent, or Firm* — Harness, Dickey & Pierce, P.L.C.

(57) ABSTRACT

A light emitting device includes: an active layer; and a first cladding layer and a second cladding layer that sandwich the active layer, wherein the active layer forms an optical waveguide that guides light, a traveling direction of the light guided in the optical waveguide changes at a first reflection part provided on a first side surface of the active layer, and the first reflection part is located outside of a region in which the first cladding layer and the second cladding layer are provided in a plan view.

20 Claims, 11 Drawing Sheets

(56) References Cited

U.S. PATENT DOCUMENTS

| | | | |
|---|---|---|---|
| 2002/0067748 A1* | 6/2002 | Coldren | H01S 5/18316 372/50.11 |
| 2010/0155759 A1* | 6/2010 | Nagawa | H01L 33/0045 257/98 |
| 2010/0171137 A1 | 7/2010 | Mochizuki | |
| 2012/0229773 A1 | 9/2012 | Mochizuki | |
| 2012/0229774 A1* | 9/2012 | Mochizuki | G02B 27/0961 353/30 |
| 2012/0235196 A1 | 9/2012 | Mochizuki | |
| 2013/0050656 A1 | 2/2013 | Mochizuki | |

FOREIGN PATENT DOCUMENTS

| | | |
|---|---|---|
| JP | 2011-023493 A | 2/2011 |
| JP | 2011-155103 A | 8/2011 |
| JP | 2013-051340 A | 3/2013 |
| JP | 2013-051341 A | 3/2013 |

OTHER PUBLICATIONS

Extended European Search Report for Patent Application No. EP 14151565.0 dated Jan. 7, 2016 (11 pages).

* cited by examiner

LIGHT EMITTING DEVICE, AND SUPER LUMINESCENT DIODE

BACKGROUND

1. Technical Field

The present invention relates to a light emitting device, a super luminescent diode, and a projector.

2. Related Art

A super luminescent diode (hereinafter, also referred to as "SLD") is a semiconductor light emitting device that has a broadband spectrum shape and thus exhibits incoherence like a typical light emitting diode. A single SLD can provide output of several hundreds of milliwatts like a semiconductor laser.

An SLD is sometimes used as a light source of a projector, for example. It is necessary to use a light source with high light output and small etendue for realization of a compact and high-brightness projector. For this purpose, it is desirable that the light emitted from an optical waveguide travel in the same direction. For example, JP-A-2011-155103 discloses a light emitting device including an optical waveguide in which the light traveling direction changes in a reflection part (reflection surface) of an active layer, and the light emitting device may allow the light emitted from two light emitting parts to travel in the same direction.

However, in the light emitting device, it is difficult to form the reflection part (reflection surface) on a flat surface at an atomic level, and minute irregularities may be formed in the reflection part. Accordingly, heat may be generated due to non-radiative recombination in the reflection part and a cladding layer near the reflection part, optical absorption in the reflection part may increase due to the heat generation, and COD (Catastrophic Optical Damage) destruction may occur in the reflection part.

SUMMARY

An advantage of some aspects of the invention is to provide a light emitting device that may suppress the occurrence of COD destruction in a reflection part of an optical waveguide in which a light traveling direction changes. Another advantage of some aspects of the invention is to provide a super luminescent diode that may suppress the occurrence of COD destruction in a reflection part of an optical waveguide in which a light traveling direction changes. Still another advantage of some aspects of the invention is to provide a projector including the light emitting device or the superluminescent diode.

A light emitting device according to an aspect of the invention includes an active layer, and a first cladding layer and a second cladding layer that sandwich the active layer, wherein the active layer forms an optical waveguide that guides light, in the optical waveguide, a traveling direction of the light guided in the optical waveguide changes in a first reflection part provided on a first side surface of the active layer and reflecting the light, and the first reflection part is located outside of a region in which the first cladding layer and the second cladding layer are provided as seen from a stacking direction of the active layer and the first cladding layer.

According to the light emitting device, the occurrence of COD destruction in the first reflection part of the optical waveguide in which the light traveling direction changes may be suppressed.

The light emitting device according to the aspect of the invention may be configured such that a II-group or XII-group element is diffused in the first reflection part.

According to the light emitting device of this configuration, the bandgap of the active layer forming the first reflection part may be made larger than the bandgap of the part of the active layer in which the II-group or XII-group element is not provided. As a result, in the first reflection part, reabsorption of light in a quantum well may be suppressed and the occurrence of COD destruction may be suppressed.

The light emitting device according to the aspect of the invention may be configured such that the optical waveguide has a first section having a strip shape connecting a first emitting part provided on a second side surface of the active layer and the first reflection part, a second section having a strip shape connecting the first reflection part and a second reflection part provided on a third side surface of the active layer, and a third section having a strip shape connecting the second reflection part and a second emitting part provided on the second side surface.

In the light emitting device of this configuration, the distance between the first emitting part and the second emitting part may be adjusted by the second section without increasing the length in the direction orthogonal to the extension direction of the second section. Thereby, in the case where the light emitting device is used as a light source of a projector, the distance between the first emitting part and the second emitting part may easily be adjusted according to an interval of a microlens (lens array), for example.

The light emitting device according to the aspect of the invention may be configured such that as seen from the stacking direction of the active layer and the first cladding layer, the first section and the second section are connected to the first reflection part and inclined at a first angle with respect to a perpendicular of the first side surface, the second section and the third section are connected to the second reflection part and inclined at a second angle with respect to a perpendicular of the third side surface, and the first angle and the second angle are equal to or larger than a critical angle.

According to the light emitting device of this configuration, the first reflection part and the second reflection part may totally reflect the light generated in the optical waveguide. Therefore, in the light emitting device, optical loss in the first reflection part and the second reflection part may be suppressed and the light may efficiently be reflected.

The light emitting device according to the aspect of the invention may be configured such that as seen from the stacking direction of the active layer and the first cladding layer, the first section is connected to the first emitting part and inclined with respect to a perpendicular of the second side surface, and the third section is connected to the second emitting part and inclined with respect to the perpendicular of the second side surface.

In the light emitting device of this configuration, direct multiple reflections of the light generated in the optical waveguide between the first emitting part and the second emitting part may be reduced. Accordingly, formation of a direct resonator may be avoided and the laser oscillation of the light generated in the optical waveguide may be suppressed. Therefore, in the light emitting device, speckle noise may be reduced.

The light emitting device according to the aspect of the invention may be configured such that the active layer includes a GaInP layer and an AlGaInP layer, and the first cladding layer and the second cladding layer are AlInP layers or AlGaInP layers having a smaller gallium composition than that of GaInP layer and AlGaInP layer forming the active layer.

In the light emitting device of this configuration, the etching rate of the active layer for an $H_3PO_4$ etchant is lower than the etching rate of the first cladding layer and the second cladding layer for the $H_3PO_4$ etchant. Therefore, by wet etching of the active layer, the first cladding layer, and the second cladding layer using the $H_3PO_4$ etchant, projecting parts of the active layer may easily be formed.

The light emitting device according to the aspect of the invention may be configured such that the first side surface is an etched surface formed by etching.

According to the light emitting device of this configuration, minute irregularities are formed more easily on the first side surface forming the first reflection part than on the cleaved surfaces formed by cleaving. However, the first reflection part is located outside of the outer edges of the first cladding layer and the second cladding layer in the plan view, and thus, heat generated due to non-radiative recombination in the first cladding layer and the second cladding layer has difficulty transferring to the first reflection part, and the occurrence of COD destruction may be suppressed in the first reflection part.

The light emitting device according to the aspect of the invention may be configured such that a low-refractive-index layer covering the first reflection part and having a lower refractive index than that of the active layer is provided.

According to the light emitting device of this configuration, the first reflection part may be protected and leakage of the light generated in the optical waveguide from the first reflection part may be suppressed.

A projector according to an aspect of the invention includes the light emitting device according to the aspect of the invention described above, a light modulation device that modulates the light emitted from the light emitting device in response to image information, and a projection device that projects an image formed by the light modulation device.

According to the projector, the light emitting device that can suppress the occurrence of COD destruction in the first reflection part of the optical waveguide in which the light traveling direction changes may be provided.

A superluminescent diode according to an aspect of the invention includes an active layer, and a first cladding layer and a second cladding layer that sandwich the active layer, wherein the active layer forms an optical waveguide that guides light, in the optical waveguide, a traveling direction of the light guided in the optical waveguide changes in a first reflection part provided on a first side surface of the active layer and reflecting the light, and the first reflection part is located outside of regions in which the first cladding layer and the second cladding layer are provided as seen from a stacking direction of the active layer and the first cladding layer.

According to the superluminescent diode, the occurrence of COD destruction in the first reflection part of the optical waveguide in which the light traveling direction changes may be suppressed.

A projector according to an aspect of the invention includes the superluminescent diode according to the aspect of the invention described above, a light modulation device that modulates the light emitted from the superluminescent diode in response to image information, and a projection device that projects an image formed by the light modulation device.

According to the projector, the superluminescent diode that can suppress the occurrence of COD destruction in the first reflection part of the optical waveguide in which the light traveling direction changes may be provided.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Embodiments of the invention will be explained in detail below with reference to the drawings. Note that the embodiments to be explained do not unduly limit the invention described in the appended claims. Further, all of the configurations to be explained are not necessarily essential component elements of the invention.

1. Light Emitting Device

Figure 1:
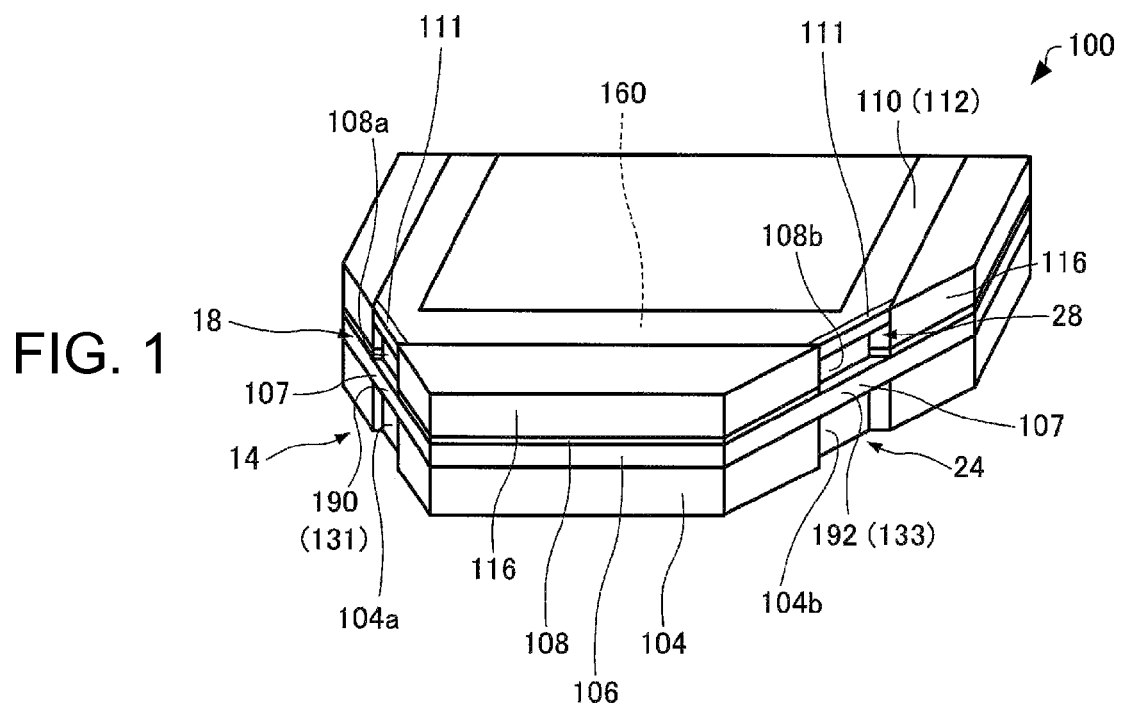
FIG. 1 is a perspective view schematically showing a light emitting device according to an embodiment.
Figure 2:
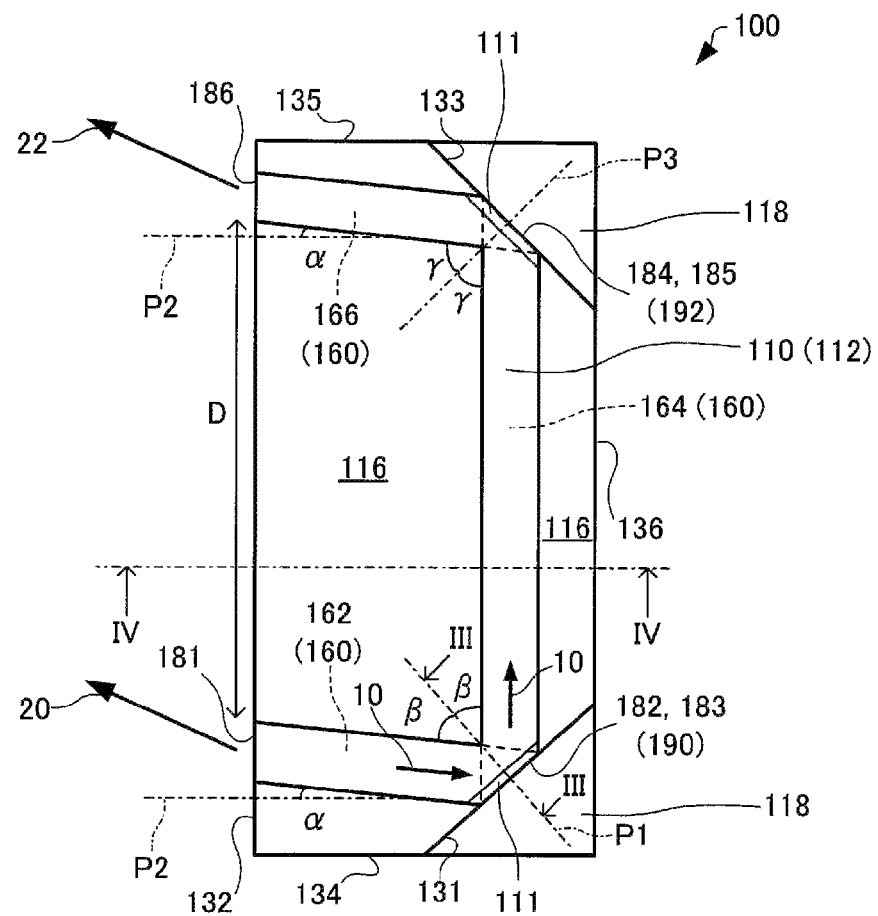
FIG. 2 is a plan view schematically showing the light emitting device according to the embodiment.
Figure 3:
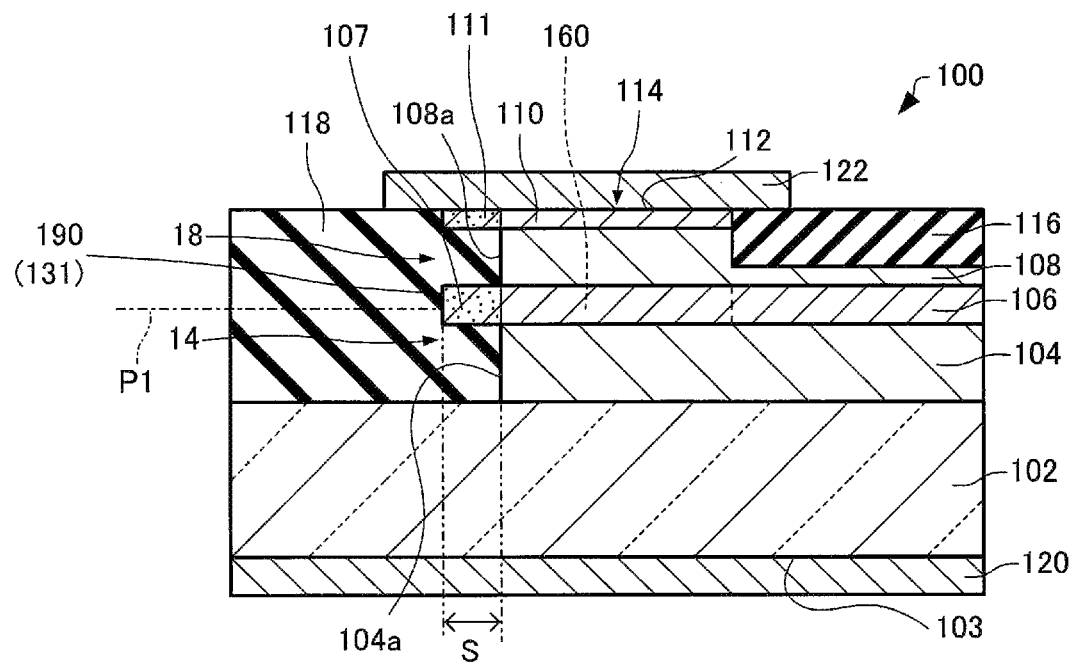
FIG. 3 is a sectional view schematically showing the light emitting device according to the embodiment.
Figure 4:
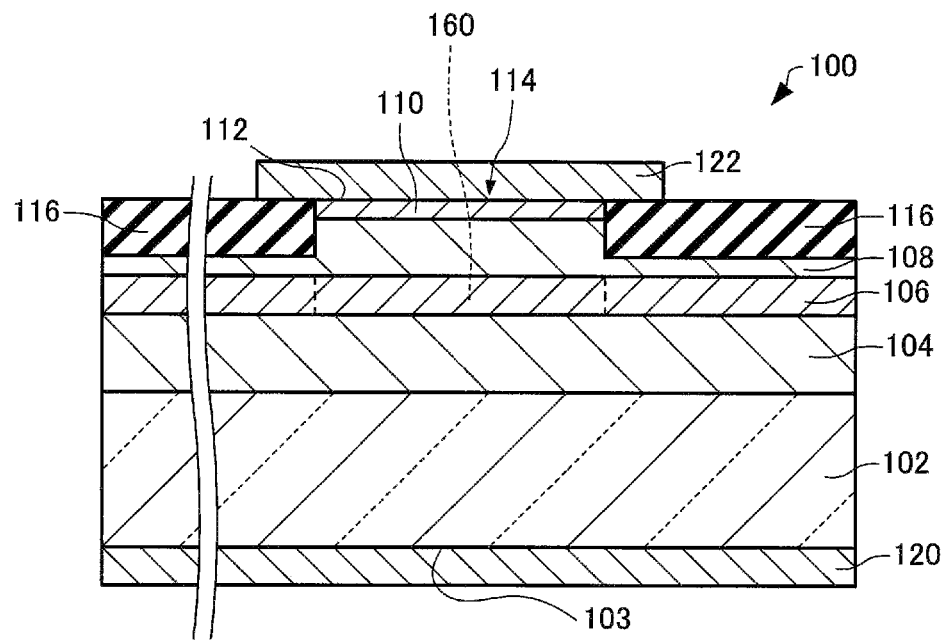
FIG. 4 is a sectional view schematically showing the light emitting device according to the embodiment.
Figure 5:
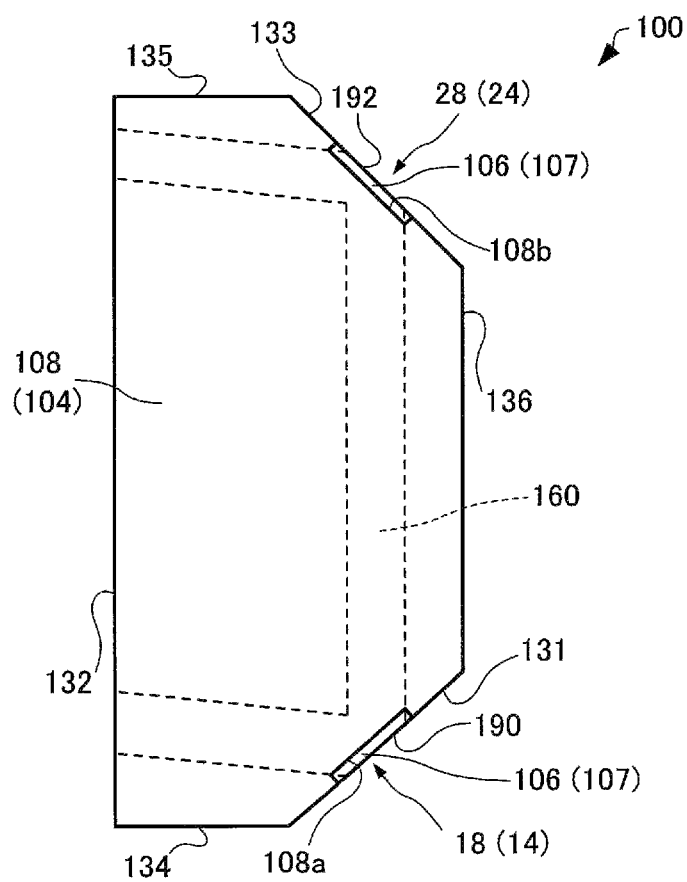
FIG. 5 is a plan view schematically showing the light emitting device according to the embodiment.

First, a light emitting device according to the embodiment will be explained with reference to the drawings. FIG. 1 is a perspective view schematically showing a light emitting device 100 according to the embodiment. FIG. 2 is a plan view schematically showing the light emitting device 100 according to the embodiment. FIG. 3 is a sectional view schematically showing the light emitting device 100 according to the embodiment along III-III line in FIG. 2. FIG. 4 is a sectional view schematically showing the light emitting device 100 according to the embodiment along IV-IV line in FIG. 2. FIG. 5 is a plan view schematically showing the light emitting device 100 according to the embodiment.

Note that for convenience, in FIG. 1, illustration of a substrate 102, a low-refractive-index layer 118, and electrodes 120, 122 is omitted. Further, in FIG. 2, illustration of the second electrode 122 is omitted. Furthermore, in FIG. 5, illustration of members other than an active layer 106 and cladding layers 104, 108 is omitted. In addition, in FIG. 2, the line and a perpendicular line P1 of a first side surface 131 of the active layer 106 are shown by one line.

The case where the light emitting device 100 is an AlGaInP (red) SLD will be explained below. In the SLD, laser oscillation may be prevented by suppression of formation of a resonator by edge reflection unlike a semiconductor laser. Accordingly, speckle noise may be reduced.

The light emitting device 100 includes the first cladding layer 104, the active layer 106, and the second cladding layer 108 as shown in FIGS. 1 to 5. Further, the light emitting device 100 may include the substrate 102, a contact layer 110, insulating layers 116, the low-refractive-index layers 118, the first electrode 120, and the second electrode 122.

The substrate 102 is a first conductivity type (e.g., n-type) GaAs substrate.

The first cladding layer 104 is formed on the substrate 102. In the example shown in FIG. 5, the planar shape of the first cladding layer 104 (the shape as seen from the stacking direction of the active layer 106 and the first cladding layer 104) is a shape having recessed parts 14, 24 formed on two sides of a hexagon. The first cladding layer 104 is an n-type AlInP layer, for example. The AlInP layer is a layer including aluminum, indium, and phosphorous. Further, the first cladding layer 104 may be an n-type AlGaInP layer with a smaller gallium composition than that of the GaInP layer and an AlGaInP layer forming the active layer 106. The AlGaInP layer is a layer including aluminum, Gallium, indium, and phosphorous.

Though not illustrated, a buffer layer may be formed between the substrate 102 and the first cladding layer 104. The buffer layer is an n-type GaAs layer, AlGaAs layer, or GaInP layer, for example. The buffer layer may improve the crystal quality of the layer formed thereon.

The active layer 106 is formed on the first cladding layer 104. The active layer 106 has a multiple quantum well (MQW) structure in which three quantum well structures each including a GaInP layer (well layer) and an AlGaInP layer (barrier layer) having a larger gallium composition than that of the first cladding layer 104 and the second cladding layer 108 are laminated, for example. The GaInP layer is a layer including indium, gallium, and phosphorous. The AlGaInP layer is a layer including aluminum, gallium, indium, and phosphorous.

The active layer 106 may further have a first guiding layer and a second guiding layer sandwiching the multiple quantum well structure. The first guiding layer and the second guiding layer are AlGaInP layers having a larger gallium composition than that of the first cladding layer 104 and the second cladding layer 108, for example.

The planar shape of the active layer 106 is a hexagonal shape, for example, as shown in FIGS. 2 and 5. The active layer 106 has a first side surface 131, a second side surface 132, a third side surface 133, a fourth side surface 134, a fifth side surface 135, and a sixth side surface 136. Of the surfaces of the active layer 106, the side surfaces 131 to 136 are not in plane contact with the first cladding layer 104 or the second cladding layer 108.

The side surfaces 131, 133 of the active layer 106 may be etched surfaces formed by etching. The side surfaces 132, 134, 135, 136 of the active layer 106 may be cleaved surfaces formed by cleaving. In the illustrated example, the side surfaces 134, 135 are orthogonal to the side surface 132. The side surface 136 is opposed to the side surface 132. The side surface 131 is connected to the side surfaces 134, 136 and inclined with respect to the side surface 132. The side surface 133 is connected to the side surfaces 135, 136 and inclined with respect to the side surface 132.

A part of the active layer 106 forms an optical waveguide 160. The part of the optical waveguide 160 in which current is injected may generate a light. The light guided within the optical waveguide 160 may obtain a gain in the part of the optical waveguide 160 in which current is injected.

The optical waveguide 160 has parts located between a contact surface 103 of the substrate 102 and the first electrode 120 and a contact surface 112 of the contact layer 110 and the second electrode 122, and parts (projecting parts) 107 located outside of the outer edges of the cladding layers 104, 108 in a plan view (i.e., outside of regions in which the cladding layers 104, 108 are provided in the plan view). The parts of the optical waveguide 160 located between the contact surface 103 and the contact surface 112 (the parts other than the projecting parts 107) are parts in which currents are injected and the optical waveguide 160 may provide gains to the light guided within the optical waveguide 160 in the parts.

The optical waveguide 160 has a first section 162, a second section 164, and a third section 166 as shown in FIG. 2.

The first section 162 extends from the first side surface 131 to the second side surface 132 in the plan view. In other words, the first section 162 connects the first side surface 131 and the second side surface 132 in the plan view. The first section 162 has a predetermined width and a linear strip-shaped longitudinal shape along the extension direction of the first section 162 in the plan view. The first section 162 has a first end surface 181 provided in the connection part to the second side surface 132 and a second end surface 182 provided in the connection part to the first side surface 131. The first end surface 181 may function as an emitting part.

Note that the extension direction of the first section 162 refers to an extension direction of the line passing through the center of the first end surface 181 and the center of the second end surface 182 in the plan view, for example. Further, the extension direction of the first section 162 may refer to an extension direction of a boundary line of the first section 162 (and the region except the first section 162). Similarly, in the other sections of the optical waveguide 160, the extension direction of the other section refers to an extension direction of a line passing through the centers of the two end surfaces in the plan view, for example. Further, the extension direction of the other section refers to an extension direction of a boundary line of the other section (and the region except the other section).

The first section 162 is connected to the second side surface 132 (first emitting part 181) and inclined at an angle α with respect to a perpendicular line P2 of the second side surface 132 in the plan view. In other words, the extension direction of the first section 162 has the angle of α with respect to the perpendicular line P2. The angle α is an acute angle larger than 0° and smaller than a critical angle.

The first section 162 is connected to the first side surface 131 (first reflection part 190) and inclined at an angle (first angle) β with respect to the perpendicular line P1 of the first side surface 131 in the plan view. In other words, the extension direction of the first section 162 has the angle of β with respect to the perpendicular line P1.

The second section 164 extends from the first side surface 131 to the third side surface 133 in the plan view. In other words, the second section 164 connects the first side surface 131 and the third side surface 133 in the plan view. The second section 164 has a predetermined width and a linear strip-shaped longitudinal shape along the extension direction of the second section 164 in the plan view. The second section 164 has a third end surface 183 provided in the connection part to the first side surface 131 and a fourth end surface 184 provided in the connection part to the third side surface 133. The extension direction of the second section 164 is parallel to the second side surface 132, for example, in the plan view.

Note that "the extension direction of the second section 164 is parallel to the second side surface 132" means that the inclination angle of the second section 164 with respect to the second side surface 132 is within ±1° in the plan view in consideration of manufacturing variations or the like.

The third end surface 183 of the second section 164 overlaps at least in a part with the second end surface 182 of the first section 162 on the first side surface 131. In the illustrated example, the second end surface 182 and the third end surface 183 completely overlap on the first side surface 131.

The second section 164 is connected to the first side surface 131 (first reflection part 190) and inclined at the angle (first angle) β with respect to the perpendicular line P1 of the first side surface 131 in the plan view. In other words, the extension direction of the second section 164 has the angle of β with respect to the perpendicular line P1. That is, the angle of the first section 162 with respect to the perpendicular line P1 and the angle of the second section 164 with respect to the perpendicular line P1 are the same in the range of manufacturing variations. The angle β is an acute angle and equal to or larger than the critical angle, for example. Thereby, the first side surface 131 may totally reflect the light generated in the optical waveguide 160.

Note that "one angle and the other angle are the same in the range of manufacturing variations" means that the difference between the angles is within about ±2°, for example, in consideration of manufacturing variations in etching or the like.

The second section 164 is connected to the third side surface 133 (second reflection part 192) and inclined at an angle γ (second angle) with respect to a perpendicular line P3 of the third side surface 133 in the plan view. In other words, the extension direction of the second section 164 has the angle of γ with respect to the perpendicular line P3.

The length of the second section 164 in the extension direction may be larger than the length of the first section 162 in the extension direction and the length of the third section 166 in the extension direction. The length of the second section 164 in the extension direction may be equal to or larger than the sum of the length of the first section 162 in the extension direction and the length of the third section 166 in the extension direction.

Note that "the length of the second section 164 in the extension direction" may also be referred as a distance between the center of the third end surface 183 and the center of the fourth end surface 184. Regarding the other sections, similarly, the length in the extension direction may be referred to as a distance between the centers of the two end surfaces.

The third section 166 extends from the third side surface 133 to the second side surface 132 in the plan view. In other words, the third section 166 connects the third side surface 133 and the second side surface 132 in the plan view. The third section 166 has a predetermined width and a linear strip-shaped longitudinal shape along the extension direction of the third section 166 in the plan view. The third section 166 has a fifth end surface 185 provided in the connection part to the third side surface 133 and a sixth end surface 186 provided in the connection part to the second side surface 132. The sixth end surface 186 may function as an emitting part.

The fifth end surface 185 of the third section 166 overlaps at least in a part with the fourth end surface 184 of the second section 164 on the third side surface 133. In the illustrated example, the fourth end surface 184 and the fifth end surface 185 completely overlap on the third side surface 133.

The third section 166 is apart from the first section 162. In the example shown in FIG. 1, the first end surface 181 of the first section 162 and the sixth end surface 186 of the third section 166 are apart by a distance D. The distance D is appropriately determined depending on an interval of a micro lens (lens array) that light 20, 22 emitted from the end surfaces 181, 186 enter, and is from several hundreds of micrometers to one millimeter, for example.

The third section 166 is connected to the third side surface 133 (second reflection part 192) and inclined at the angle (second angle) γ with respect to the perpendicular line P3 of the third side surface 133 in the plan view. In other words, the extension direction of the third section 166 has the angle of γ with respect to the perpendicular line P3. That is, the angle of the second section 164 with respect to the perpendicular line P3 and the angle of the third section 166 with respect to the perpendicular line P3 are the same in the range of manufacturing variations. The angle γ is an acute angle and equal to or larger than the critical angle, for example. Thereby, the third side surface 133 may totally reflect the light generated in the optical waveguide 160.

The third section 166 is connected to the second side surface 132 (second emitting part 186) and inclined at the angle α with respect to the perpendicular line P2 in the plan view. In other words, the longitudinal direction of the third section 166 has the angle of α with respect to the perpendicular line P2. That is, the first section 162 and the third section 166 are connected to the second side surface 132 in the same direction and are parallel to each other in the plan view. More specifically, the extension direction of the first section 162 and the extension direction of the third section 166 are parallel to each other. Thereby, the light 20 emitted from the first end surface 181 and the light 22 emitted from the sixth end surface 186 may travel in the same direction.

As described above, the angles β, γ are set to be equal to or larger than the critical angle and the angle α is set to be smaller than the critical angle, and thereby, for the light generated in the optical waveguide 160, the reflectance of the second side surface 132 may be made lower than the reflectance of the first side surface 131 and the reflectance of the third side surface 133. That is, the first end surface 181 provided on the second side surface 132 serves as the first emitting part (first emitting part 181) that emits the light generated in the optical waveguide 160. The sixth end surface 186 provided on the second side surface 132 serves as the second emitting part (second emitting part 186) that emits the light generated in the optical waveguide 160. The region that the end surfaces 182, 183 overlap serves as the first reflection part 190 that reflects the light generated in the optical waveguide 160. The region that the end surfaces 184, 185 overlap serves as the second reflection part 192 that reflects the light generated in the optical waveguide 160.

That is, the first section 162 extends from the first emitting part 181 to the first reflection part 190 (connects the first emitting part 181 and the first reflection part 190). The second section 164 extends from the first reflection part 190 to the second reflection part 192 (connects the first reflection part 190 and the second reflection part 192). The third section 166 extends from the second reflection part 192 to the second emitting part 186 (connects the second reflection part 192 and the second emitting part 186).

The optical waveguide 160 bends (changes direction) in the reflection parts 190, 192 that is provided on the side surfaces 131, 133 of the active layer 106 and reflects the light generated in the optical waveguide 160. That is, the extension direction of the optical waveguide 160 changes in the reflection parts 190, 192. Further, in other words, the traveling direction of the light guided in the optical waveguide 160 changes in the reflection parts 190, 192. Further, the optical waveguide 160 has a U-shape (U-shape with corners) in the plan view as shown in FIG. 2.

Note that, in the illustrated example, the emitting parts 181, 186 and the reflection parts 190, 192 are exposed, however, for example, the second side surface 132 (emitting parts 181, 186) may be covered by an anti-reflection film (not shown) and the first side surface 131 and the third side surface 133 (reflection parts 190, 192) may be covered by a reflection film (not shown). Thereby, even if an incidence angle, a refractive index, or the like is in a condition that the light generated in the optical waveguide 160 is not totally reflected in the reflection parts 190, 192, the reflectance of the second side surface 132 in the wavelength range of the light generated in the optical waveguide 160 may be made lower than the reflectance of the first side surface 131 and the reflectance of the third side surface 133. Further, as the second side surface 132 is covered by the anti-reflection film, direct multiple reflections of the light generated in the optical waveguide 160 between the first end surface 181 and the sixth end surface 186 may be suppressed. Accordingly, formation of a direct resonator may be avoided and the laser oscillation of the light generated in the optical waveguide 160 may be suppressed.

As the reflection film and the anti-reflection film, for example, $SiO_2$ layers, $Ta_2O_5$ layers, $Al_2O_3$ layers, TiN layers, $TiO_2$ layers, SiON layers, SiN layers, AlON layers, AlN layers or multilayer films thereof are used. Further, high reflectance may be obtained using DBR (Distributed Bragg Reflector) formed by etching the side surfaces 131, 133.

Furthermore, in the illustrated example, the angle α is larger than 0°. Thereby, direct multiple reflections of the light generated in the optical waveguide 160 between the first end surface 181 and the sixth end surface 186 may be avoided. As a result, formation of the direct resonator may be avoided, and the laser oscillation of the light generated in the optical waveguide 160 may be suppressed or prevented.

The first reflection part 190 is located outside of the outer edges of the first cladding layer 104 and the second cladding layer 108 in the plan view. Further, the first reflection part 190 is located outside of the regions in which the cladding layers 104, 108 are provided in the plan view. That is, the first reflection part 190 is not located inside of the outer edges of the cladding layers 104, 108 and not located to overlap with the outer edges of the cladding layers 104, 108 in the plan view. In the example shown in FIGS. 1 and 3, recessed parts 14, 18 are provided in the first cladding layer 104 and the second cladding layer 108, respectively. The active layer 106 has the projecting part 107 projecting in the direction of the perpendicular line P1 of the first side surface 131 more than a side surface 104a of the first cladding layer 104 defining the recessed part 14 and a side surface 108a of the second cladding layer 108 defining the recessed part 18. The first reflection part 190 is formed by the projecting part 107.

The distance (the distance in the direction of the perpendicular line P1) S from the first reflection part 190 to the side surfaces 104a, 108a of the cladding layers 104, 108 is from 100 nm to 20 μm, for example. Note that, in the illustrated example, the distance from the first reflection part 190 to the side surface 104a and the distance from the first reflection part 190 to the side surface 108a are the same, however, they may be different.

Similarly, the second reflection part 192 is located outside of the outer edges of the first cladding layer 104 and the second cladding layer 108 in the plan view. Further, the second reflection part 192 is located outside of the regions in which the cladding layers 104, 108 are provided in the plan view. That is, the second reflection part 192 is not located inside of the outer edges of the cladding layers 104, 108 and not located to overlap with the outer edges of the cladding layers 104, 108 in the plan view. In the illustrated example, recessed parts 24, 28 are provided in the first cladding layer 104 and the second cladding layer 108, respectively. The active layer 106 has the projecting part 107 projecting in the direction of the perpendicular line P3 of the third side surface 133 more than a side surface 104b of the first cladding layer 104 defining the recessed part 24 and a side surface 108b of the second cladding layer 108 defining the recessed part 28. The second reflection part 192 is formed by the projecting part 107.

The distance (the distance in the direction of the perpendicular line P3) from the second reflection part 192 to the side surfaces 104b, 108b of the cladding layers 104, 108 is from 100 nm to 20 μm, for example. Note that the distance from the second reflection part 192 to the side surface 104b and the distance from the second reflection part 192 to the side surface 108b may be the same or different.

In the first reflection part 190 and the second reflection part 192, a II-group or XII-group element is diffused. More specifically, in the projecting parts 107, the II-group or XII-group element is diffused.

The II-group or XII-group element diffused in the first reflection part 190 and the second reflection part 192 is zinc, magnesium, or beryllium, for example. The element may enter the site of gallium or aluminum of the AlGaInP layer and the GaInP layer forming the active layer 106, for example. In this regard, the II-group or XII-group element enters, and thereby, the gallium or aluminum moved from the original site may enter another site of gallium or aluminum. That is, in the AlGaInP layer and the GaInP layer, gallium and aluminum are mutually diffused. Thereby, the bandgap of the GaInP layer may be made larger to be closer to the bandgap of the AlGaInP layer. That is, as for the bandgap of the GaInP layer having the smallest bandgap in the layers forming the active layer 106, the bandgap in the projecting part 107 (the part in which the element is diffused) is larger than the bandgap in the other part of the active layer 106 in which the element is not diffused.

The low-refractive-index layers 118 cover the first reflection part 190 and the second reflection part 192. More specifically, the low-refractive-index layers 118 are provided to cover the projecting parts 107 of the active layer 106. In the example shown in FIG. 2, the planar shape of the low-refractive-index layer 118 is a triangular shape, however, the shape is not particularly limited.

The low-refractive-index layer 118 has a lower refractive index than the refractive index of the active layer 106. That is, the refractive index of the low-refractive-index layer 118 is lower than the refractive indices of the well layer, the barrier layer, and the guiding layer forming the active layer 106. Thereby, leakage of the light generated in the optical waveguide 160 from the projecting parts 107 may be suppressed.

The low-refractive-index layer 118 is, for example, a polyimide layer, a SOG (Spin on Glass) layer formed by dissolving silica ($SiO_2$) in a solvent, or a dielectric layer formed on a side wall by oblique evaporation or CVD (Chemical Vapor Deposition). Note that it is not necessarily to provide the low-refractive-index layers 118. That is, the low-refractive-index layers 118 may be air layers.

The second cladding layer 108 is formed on the active layer 106 as shown in FIGS. 3 and 4. That is, the first cladding layer 104 and the second cladding layer 108 sandwich the active layer 106. The planar shape of the second cladding layer 108 is a shape having the recessed parts 18, 28 on the two sides of a hexagon, for example. The planar shape of the second cladding layer 108 is the same as the planar shape of the first cladding layer 104, for example. The second cladding layer 108 is a p-type AlInP layer, for example. Further, the second cladding layer 108 may be a p-type AlGaInP layer having a smaller gallium composition than that of the GaInP layer or the AlGaInP layer forming the active layer 106.

For example, the p-type second cladding layer 108, the active layer 106 without doped impurity, and the n-type first cladding layer 104 form a pin diode. Each of the first cladding layer 104 and the second cladding layer 108 has a larger bandgap and a lower refractive index than those of the active layer 106. The active layer 106 has a function of generating light by injecting currents using the first electrode 120 and the second electrode 122 and guiding the light while amplifying it. The first cladding layer 104 and the second cladding layer 108 have a function of confining injection carriers (electrons and holes) and light (a function of suppressing leakage of light) by sandwiching the active layer 106 in between.

In the light emitting device 100, when a forward bias voltage of a pin diode is applied (a current is injected) between the first electrode 120 and the second electrode 122, the optical waveguide 160 is generated in the active layer 106 and recombination of electrons and holes occurs in the optical waveguide 160. Light is generated by the recombination. From the light as starting points, stimulated emission sequentially occurs and light intensity is amplified within the optical waveguide 160 in which the currents are injected. The parts of the optical waveguide 160 in which the currents are injected are formed by the active layer 106 that guides the light and the cladding layers 104, 108 that suppress leakage of the light. Note that, in the projecting parts 107 of the active layer 106, the optical waveguide 160 is formed by the projecting parts 107 that guide the light and the low-refractive-index layers 118 that suppress leakage of the light.

For example, as shown in FIG. 2, the light 10 generated in the first section 162 within the optical waveguide 160 and traveling toward the first side surface 131 is amplified within the first section 162 in which currents are injected, and then, reflected in the first reflection part 190 and travels toward the third side surface 133 within the second section 164. Then, the light is further reflected in the second reflection part 192, travels within the third section 166, and is emitted as the light 22 from the sixth end surface (second emitting part) 186. In this regard, the light intensity is also amplified within the second section 164 and the third section 166 in which currents are injected. Similarly, the light generated in the third section 166 and traveling toward the third side surface 133 side is amplified within the third section 166 in which currents are injected, and then, reflected in the second reflection part 192 and travels toward the first side surface 131 within the second section 164. Then, the light is further reflected in the first reflection part 190, travels within the first section 162, and is emitted as the light 20 from the first end surface (first emitting part) 181. In this regard, the light intensity is also amplified within the first section 162 and the second section 164 in which currents are injected.

Note that some of the light generated in the first section 162 is directly emitted as the light 20 from the first end surface 181. Similarly, some of the light generated in the third section 166 is directly emitted as the light 22 from the sixth end surface 186. The intensity of this light is similarly amplified within the first section 162 and the third section 166 in which currents are injected.

The contact layer 110 is formed on the second cladding layer 108 as shown in FIGS. 3 and 4. It is possible that the contact layer 110 has ohmic contact with the second electrode 122. The upper surface 112 of the contact layer 110 is a contact surface between the contact layer 110 and the second electrode 122. In the illustrated example, the planar shape of the upper surface 112 of the contact layer 110 is the same as the planar shape of the optical waveguide 160. The contact layer 110 is a p-type GaAs layer, for example.

The contact layer 110 has a projecting part 111 projecting in the direction of the perpendicular line P1 more than a side surface 108a of the second cladding layer 108 as shown in FIG. 3. That is, the contact layer 110 has the part (projecting part) 111 located outside of the outer edge of the second cladding layer 108 in the plan view. In the projecting part 111, a II-group or XII-group element may be diffused like the projecting parts 107 of the active layer 106. Though not illustrated, the contact layer 110 may not have the projecting part 111, but may have a side surface flush with the side surface 108a of the second cladding layer 108 or recessed more than the side surface 108a of the second cladding layer 108.

The contact layer 110 and a part of the second cladding layer 108 form a columnar part 114. The planar shape of the columnar part 114 is the same as the planar shape of the optical waveguide 160 except the projecting parts 107. For example, depending on the planar shape of the columnar part 114, the current path between the electrodes 120, 122 is determined, and, as a result, the planar shape of the optical waveguide 160 except the projecting parts 107 is determined. Note that, though not illustrated, the side surface of the columnar part 114 may be inclined.

The insulating layers 116 are formed on the second cladding layer 108 at the side of the columnar part 114 (around the columnar part 114 in the plan view). The insulating layers 116 are in contact with the side surface of the columnar part 114. The upper surfaces of the insulating layer 116 are continuous with the upper surface 112 of the contact layer 110. The insulating layers 116 are SiN layers, $SiO_2$ layers, SiON layers, $Al_2O_3$ layers, or polyimide layers, for example. In the case where the above described materials are used as the insulating layers 116, the currents between the electrodes 120, 122 may flow in the columnar part 114 sandwiched by the insulating layers 116.

The insulating layer 11b may have a smaller refractive index than the refractive index of the second cladding layer 108. In this case, the effective refractive index of the vertical section of the part in which the insulating layer 116 is formed is smaller than the effective refractive index of the vertical section of the part in which the insulating layer 116 is not formed, i.e., the part in which the columnar part 114 is formed. Thereby, in the planar direction (the direction orthogonal to the vertical direction), the light may efficiently be confined within the optical waveguide 160. Note that, though not illustrated, the insulating layers 116 are not necessarily provided. That is, the insulating layers 116 may be air layers.

The first electrode 120 is formed on the entire surface under the substrate 102. More specifically, the first electrode 120 is formed on the lower surface 103 of the layer in ohmic contact with the first electrode 120 (the substrate 102 in the illustrated example). The first electrode 120 is electrically connected to the first cladding layer 104 via the substrate 102. The first electrode 120 is one electrode for driving the light emitting device 100. As the first electrode 120, for example, an electrode formed by stacking a Cr layer, an AuGe layer, an Ni layer, an Au layer in this order from the substrate 102 side is used.

Note that a second contact layer (not shown) may be provided between the first cladding layer 104 and the substrate 102, the second contact layer may be exposed to the opposite side to the substrate 102 by dry etching from the opposite side to the substrate 102, and the first electrode 120 may be provided on the second contact layer. Thereby, a single-sided electrode may be obtained. This form is particularly effective in the case where the substrate 102 has insulation properties.

The second electrode 122 is formed on the contact layer 110. More specifically, the second electrode 122 is formed in contact with the upper surface 112 of the contact layer 110. Further, the second electrode 122 may be formed not only on the upper surface 112 of the contact layer 110 but also on the insulating layers 116 and the low-refractive-index layers 118 as shown in FIG. 3. The second electrode 122 is electrically connected to the second cladding layer 108 via the contact layer 110. The second electrode 122 is the other electrode for driving the light emitting device 100. As the second electrode 122, for example, an electrode formed by stacking a Cr layer, an AuZn layer, an Au layer in this order from the contact layer 110 side is used.

The case of using AlGaInP material has been explained above as an example of the light emitting device 100 according to the embodiment, however, the light emitting device 100 may use various materials that can form the optical waveguide. Semiconductor materials including AlGaN, GaN, InGaN, GaAs, AlGaAs, InGaAs, InGaAsP, InP, GaP, AlGaP, ZnCdSe, for example, may be used.

Further, in the above description, the light emitting device 100 according to the embodiment has been explained as the so-called index-guiding type that confines light by providing a refractive index difference between the region in which the insulating layers 116 are formed and the region in which the insulating layers 116 are not formed, i.e., the region forming the columnar part 114. Though not illustrated, the light emitting device according to the embodiment may be a so-called gain-guiding type in which the refractive index difference is not provided by forming the columnar part 114 and the optical waveguide 160 generated by current injection serves as the waveguide region as it is.

Note that, in the above description, the form in which the reflection parts 190, 192 are located outside of the outer edges of the cladding layers 104, 108 in the plan view has been explained, however, the emitting parts 181, 186 may be further located outside of the outer edges of the cladding layers 104, 108 in the plan view (i.e., outside of the regions in which the cladding layers 104, 108 are provided in the plan view).

The light emitting device 100 according to the embodiment may be applied to a light source for a projector, a display, illumination equipment, measuring equipment, or the like, for example.

The light emitting device 100 has the following advantages, for example.

According to the light emitting device 100, in the first reflection part 190 for reflecting light provided on the first side surface 131 of the active layer 106, the traveling direction of the light guided in the optical waveguide 160 changes. Further, the first reflection part 190 is provided outside of the regions in which the first cladding layer 104 and the second cladding layer 108 are provided in the plan view. Accordingly, the heat generated due to non-radiative recombination in the first cladding layer 104 and the second cladding layer 108 has difficulty transferring to the first reflection part 190, and, in the light emitting device 100, the occurrence of COD destruction may be suppressed in the first reflection part 190. That is, the occurrence of COD destruction may be suppressed in the first reflection part 190 of the optical waveguide in which the light traveling direction changes. As a result, the light emitting device 100 may have high reliability, for example.

Generally, on faces of a crystal, the so-called dangling bond that atoms forming the crystal are not able to supply electrons to combine each other is formed. Further, in the reflection part, it is difficult to form the reflection part on a flat surface at the atomic level and minute irregularities may be formed therein. Accordingly, more dangling bonds are formed on the side surface of the active layer forming the reflection parts. When a current flows in the part, more surface recombination currents flow and heat is generated due to non-radiative recombination by the surface recombination currents. When heat is generated, the bandgap becomes smaller and light reabsorption in the quantum well becomes larger. When the light reabsorption occurs, heat generated due to non-radiative recombination increases. In this manner, heat generation and light reabsorption are repeated and the side surface is finally destroyed, and the COD destruction occurs.

In the light emitting device 100, as described above, the first reflection part 190 is located outside of the regions in which the cladding layers 104, 108 are provided in the plan view. That is, no cladding layer exists in the vertical directions of the active layer 106 forming the part near the first reflection part 190. Accordingly, transfer of the heat generated by non-radiative recombination on the side surfaces 104a, 108a of the cladding layers 104, 108 near the first reflection part 190 to the first reflection part 190 may be suppressed, and the temperature rise of the first reflection part 190 may be reduced by the suppression. Therefore, in the light emitting device 100, the occurrence of COD destruction may be suppressed in the first reflection part 190.

Similarly, in the light emitting device 100, in the second reflection part 192 for reflecting the light provided on the third side surface 133 of the active layer 106, the traveling direction of the light guided in the optical waveguide 160 changes. Further, the second reflection part 192 is provided outside of the regions in which the first cladding layer 104 and the second cladding layer 108 are provided in the plan view. Accordingly, the heat generated due to non-radiative recombination in the first cladding layer 104 and the second cladding layer 108 has difficulty transferring to the first reflection part 190, and, in the light emitting device 100, the occurrence of COD destruction may be suppressed in the second reflection part 192.

According to the light emitting device 100, the II-group or XII-group element is diffused in the first reflection part 190. Thereby, the bandgap of the active layer 106 forming the first reflection part 190 may be made larger than the bandgap of the other part of the active layer 106 in which the above described element is not diffused. More specifically, the element is diffused in the first reflection part 190, and thereby, gallium and aluminum are mutually diffused in the active layer 106 and the bandgap of the quantum well layer having the smallest bandgap in the layers forming the active layer 106 may be made larger. As a result, in the first reflection part 190, light reabsorption in the quantum well may be suppressed and the occurrence of COD destruction may be suppressed.

Similarly, in the light emitting device 100, the II-group or XII-group element is diffused in the second reflection part 192. Thereby, in the second reflection part 192, light reabsorption in the quantum well may be suppressed and the occurrence of COD destruction may be suppressed.

Furthermore, in the light emitting device 100, as described above, the reflection parts 190, 192 are provided outside of the regions in which the cladding layers 104, 108 are provided in the plan view. Accordingly, even when the diffusion element is diffused in the active layer 106 forming the reflection parts 190, 192 (specifically, the projecting parts 107), the light may be confined in the vertical directions in the projecting parts 107. Therefore, almost all light may be guided within the projecting parts 107.

For example, in the case where the reflection part overlaps with the outer edge of the cladding layer in the plan view (the cladding layer is located also in the vertical direction of the reflection part of the active layer), when the II-group or XII-group element is diffused in the active layer, the element is also diffused in the cladding layer located on the active layer. Accordingly, mutual diffusion of gallium and aluminum occurs at the boundary between the guiding layer (e.g., the AlGaInP layer) of the active layer and the cladding layer (AlInP layer). Thereby, the compositions of gallium and aluminum of the guiding layer and the cladding layer may be closer to each other, the refractive index difference that enables total reflection of light between the guiding layer and the cladding layer may not be obtained, and the light may not be confined or guided within the guiding layer. The diffusion region in which the element is diffused is formed over 10 μm or more in the planar direction. Therefore, in consideration of the wavelength of the light within the active layer being about 200 nm in the case of red light (the value obtained by division of the wavelength by the effective refractive index), when the diffusion region is formed in the reflection part, it may be impossible for the light reflected in the reflection part to be emitted from the emitting part unless the light propagates the distance of 50 times or more the wavelength within the diffusion region. Accordingly, if the total reflection condition is not satisfied between the guiding layer and the cladding layer by the diffusion of the element, almost all light spreads in the vertical directions in the diffusion region and significant waveguide loss (coupling loss between the waveguide sections in the reflection part) is produced.

In the light emitting device 100, the problem may be avoided and, even when the II-group or XII-group element is diffused in the projecting parts 107 forming the reflection parts 190, 192 as described above, the light may be confined in the vertical direction in the projecting parts 107. Accordingly, the waveguide loss of the light in the projecting parts 107 may be reduced. Therefore, power consumption may be kept lower and an environment-friendly light emitting device may be realized.

According to the light emitting device 100, the optical waveguide 160 has the first section 162 having the strip shape connecting the first emitting part 181 provided on the second side surface 132 and the first reflection part 190 provided on the first side surface 131, the second section 164 having the strip shape connecting the first reflection part 190 and the second reflection part 192 provided on the third side surface 133, and the third section 166 having the strip shape connecting the second reflection part 192 and the second emitting part 186 provided on the second side surface 132. Accordingly, in the light emitting device 100, by adjusting the length of the second section 164 without increasing the length in the direction orthogonal to the extension direction of the second section 164, the distance D between the emitting parts 181, 186 may be adjusted (see FIG. 2). Thereby, in the case where the light emitting device 100 is used as a light source for a projector, for example, the distance between the emitting parts 181, 186 may easily be adjusted according to an interval of the micro lens (lens array).

According to the light emitting device 100, in the plan view, the first section 162 and the second section 164 are connected to the first reflection part 190 and inclined at the first angle β with respect to the perpendicular line P1 of the first side surface 131, the second section 164 and the third section 166 are connected to the second reflection part 192 and inclined at the second angle γ with respect to the perpendicular line P3 of the third side surface 133, and the first angle β and the second angle γ are equal to or more than the critical angle. Accordingly, the reflection parts 190, 192 may totally reflect the light generated in the optical waveguide 160. Therefore, in the light emitting device 100, optical loss in the reflection parts 190, 192 may be suppressed and the light may efficiently be reflected. Further, a process of covering the reflection parts 190, 192 with reflection films may be unnecessary, and the manufacturing cost and the materials and resources necessary for manufacturing may be reduced.

According to the light emitting device 100, in the plan view, the first section 162 is connected to the first emitting part 181 and inclined with respect to the perpendicular line P2 of the second side surface 132, and the third section 166 is connected to the second emitting part 186 and inclined with respect to the perpendicular line P2 of the second side surface 132. Accordingly, in the light emitting device 100, direct multiple reflections of the light generated in the optical waveguide 160 between the first end surface 181 and the sixth end surface 186 may be reduced. Accordingly, formation of a direct resonator may be avoided and the laser oscillation of the light generated in the optical waveguide 160 may be suppressed. Therefore, speckle noise may be reduced in the light emitting device 100.

According to the light emitting device 100, the active layer 106 includes the GaInP layer and the AlGaInP layer, and the first cladding layer 104 and the second cladding layer 108 are the AlInP layers or the AlGaInP layers having a smaller gallium composition than that of the GaInP layer and the AlGaInP layer forming the active layer 106. Accordingly, the etching rate of the active layer 106 for an $H_3PO_4$ etchant is lower than the etching rate of the cladding layers 104, 108 for the $H_3PO_4$ etchant. Therefore, by wet etching of the active layer 106 and the cladding layers 104, 108 using the $H_3PO_4$ etchant, the projecting parts 107 of the active layer 106 may easily be formed.

According to the light emitting device 100, the first side surface 131 is an etched surface formed by etching. Accordingly, minute irregularities are formed more easily on the first side surface 131 forming the first reflection part 190 than on the cleaved surfaces formed by cleaving. However, in the light emitting device 100, as described above, the first reflection part 190 is located outside of the outer edges of the cladding layers 104, 108 in the plan view, and thus, the occurrence of COD destruction may be suppressed in the first reflection part 190.

Similarly, in the light emitting device 100, even when the third side surface 133 is the etched surface formed by etching, the occurrence of COD destruction may be suppressed in the second reflection part 192.

According to the light emitting device 100, the low-refractive-index layer 118 covering the first reflection part 190 and having the lower refractive index than that of the active layer 106 is provided. Thereby, the first reflection part 190 may be protected and leakage of the light generated in the optical waveguide 160 from the first reflection part 190 may be suppressed.

Similarly, in the light emitting device 100, by the low-refractive-index layer 118 covering the second reflection part 192 and having the lower refractive index than that of the active layer 106, the second reflection part 192 may be protected and leakage of the light generated in the optical waveguide 160 from the second reflection part 192 may be suppressed.

2. Method of Manufacturing Light Emitting Device

Next, a method of manufacturing the light emitting device according to the embodiment will be explained with reference to the drawings. FIGS. 6 to 14 are sectional views schematically showing manufacturing processes of the light emitting device 100 according to the embodiment and correspond to FIG. 3.

Figure 6:
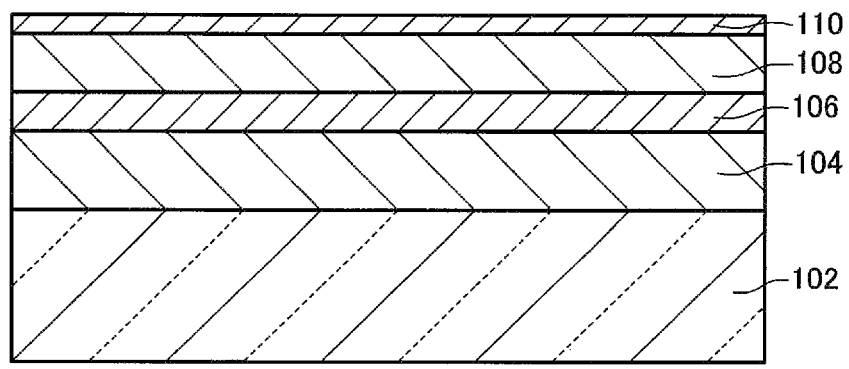
FIG. 6 is a sectional view schematically showing a manufacturing process of the light emitting device according to the embodiment.

As shown in FIG. 6, on the substrate 102, the first cladding layer 104, the active layer 106, the second cladding layer 108, and the contact layer 110 are epitaxially grown in this order. As a method of epitaxial growth, for example, MOCVD (Metal Organic Chemical Vapor Deposition) or MBE (Molecular Beam Epitaxy) is used.

Figure 7:
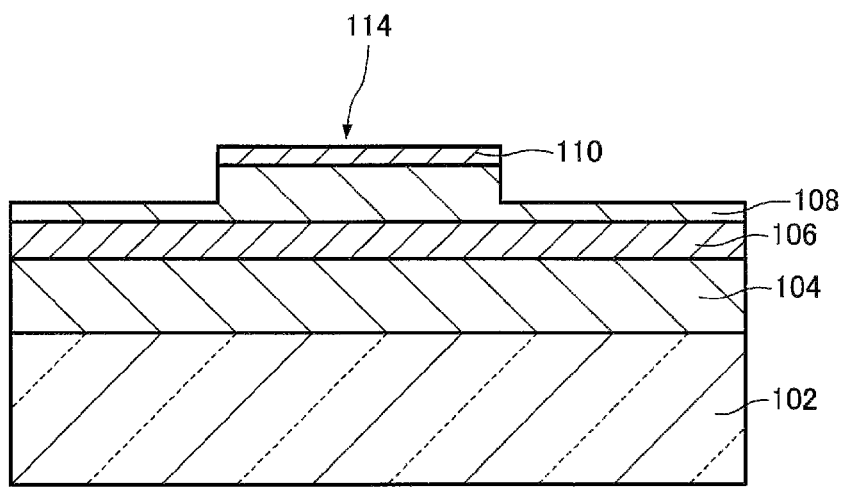
FIG. 7 is a sectional view schematically showing a manufacturing process of the light emitting device according to the embodiment.

As shown in FIG. 7, the contact layer 110 and the second cladding layer 108 are patterned. The patterning is performed using photolithography and etching, for example. At the process, the columnar part 114 may be formed.

Figure 8:
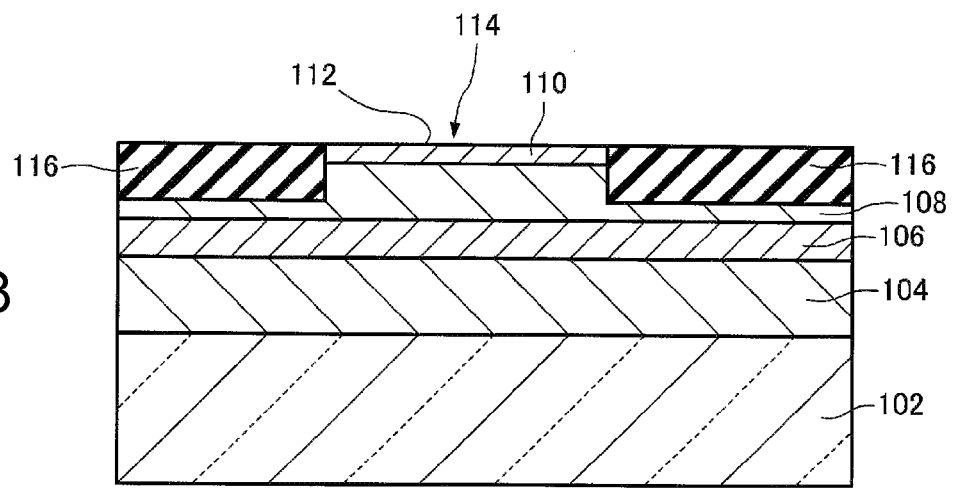
FIG. 8 is a sectional view schematically showing a manufacturing process of the light emitting device according to the embodiment.

As shown in FIG. 8, the insulating layers 116 are formed to cover the side surface of the columnar part 114. Specifically, first, for example, an insulating member (not shown) is deposited in the upper part of the second cladding layer 108 (including the contact layer 110) by CVD or coating. Then, the upper surface 112 of the contact layer 110 is exposed by etching, for example. At the process, the insulating layers 116 may be formed.

Figure 9:
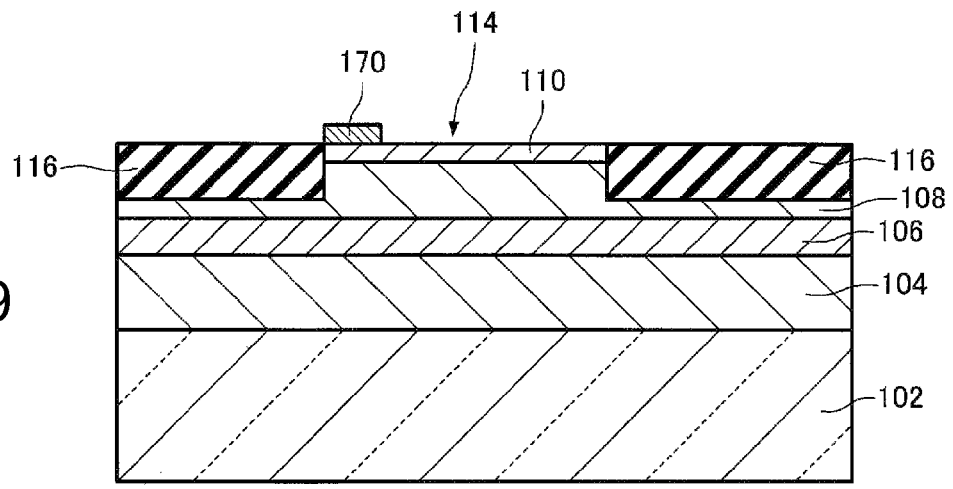
FIG. 9 is a sectional view schematically showing a manufacturing process of the light emitting device according to the embodiment.

As shown in FIG. 9, a diffusion region formation layer 170 is formed on the contact layer 110. The diffusion region formation layer 170 is formed by deposition by sputtering or vacuum evaporation and patterning by photolithography and etching, for example. The etching is performed by dry etching using a $CHF_3$ gas or $CF_4$ gas or wet etching using a BHF (buffered hydrofluoric acid) solution, for example. The diffusion region formation layer 170 contains a II-group or XII-group element. Specifically, the material of the diffusion region formation layer 170 is zinc, magnesium, beryllium, or oxides of them.

Figure 10:
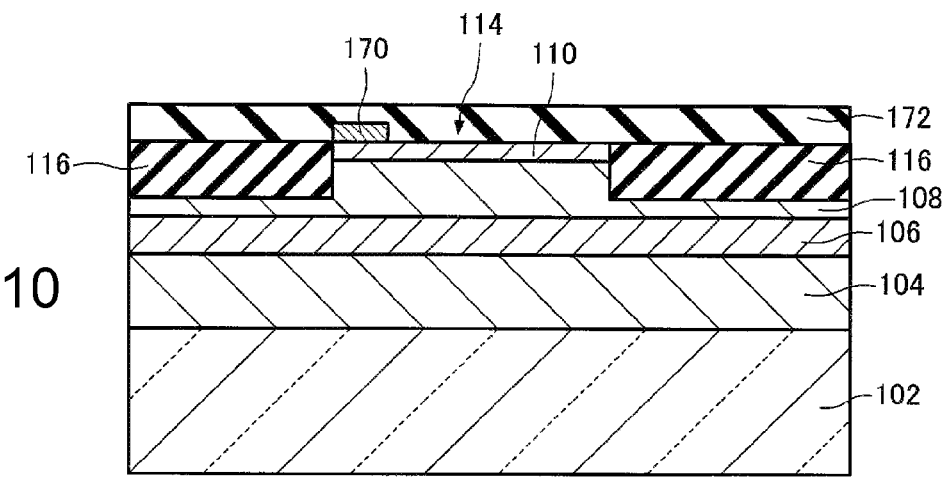
FIG. 10 is a sectional view schematically showing a manufacturing process of the light emitting device according to the embodiment.

As shown in FIG. 10, an insulating layer 172 is formed on the contact layer 110 and the insulating layers 116 to cover the diffusion region formation layer 170. The insulating layer 172 is formed by CVD, for example. The insulating layer 172 is a silicon nitride (SiN) layer or a silicon oxide nitride (SiON) layer, for example.

Figure 11:
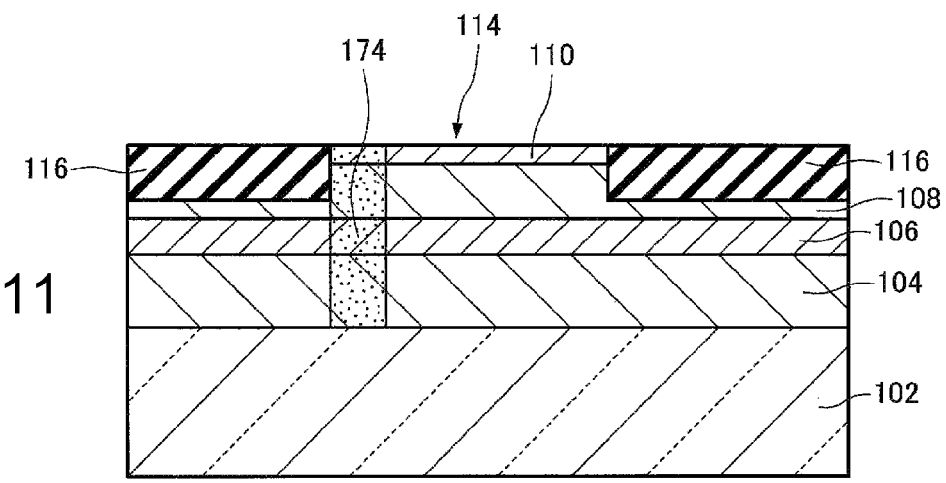
FIG. 11 is a sectional view schematically showing a manufacturing process of the light emitting device according to the embodiment.

As shown in FIG. 11, the diffusion region formation layer 170 is diffused by heat treatment and a diffusion region 174 is formed. The heat treatment is performed so that the diffusion region 174 may reach at least the first cladding layer 104. More specifically, the heat treatment is performed for 30 minutes at about 600° C. Thereby, the diffusion region 174 in which the II-group or XII-group element is diffused may be formed in the contact layer 110, the second cladding layer 108, the active layer 106, and the first cladding layer 104 located under the diffusion region formation layer 170. In the illustrated example, the sectional shape of the diffusion region 174 is a rectangular, however, the shape is not particularly limited. Then, the insulating layer 172 and the diffusion region formation layer 170 are removed using hydrofluoric acid (HF) or the like.

Figure 12:
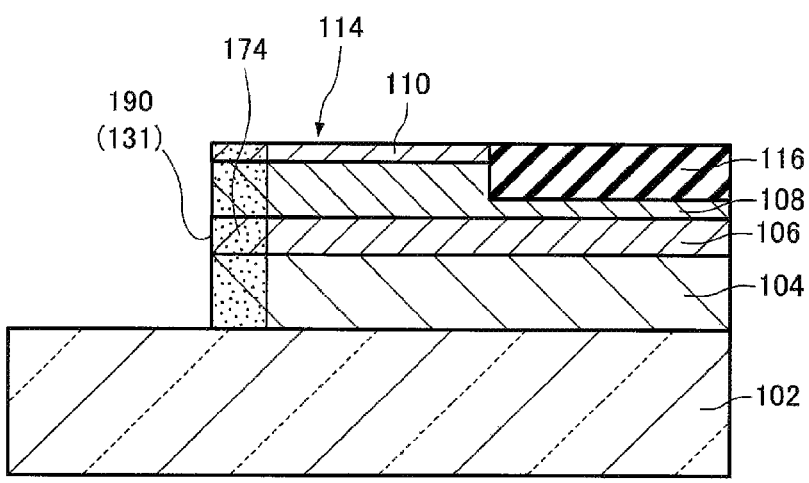
FIG. 12 is a sectional view schematically showing a manufacturing process of the light emitting device according to the embodiment.

As shown in FIG. 12, the insulating layers 116, the second cladding layer 108, the active layer 106, and the first cladding layer 104 are patterned and the first side surface 131 (first reflection part 190) of the active layer 106 is exposed. The patterning is performed using photolithography and etching, for example. At the process, the third side surface 133 (second reflection part 192) of the active layer 106 may be exposed. The reflection parts 190, 192 are etched surfaces formed by etching.

Note that, in the illustrated example, the first cladding layer 104 is etched so that the upper surface of the substrate 102 may be exposed, however, etching may be stopped in the middle of the first cladding layer 104 so that the upper surface of the substrate 102 may not be exposed.

Figure 13:
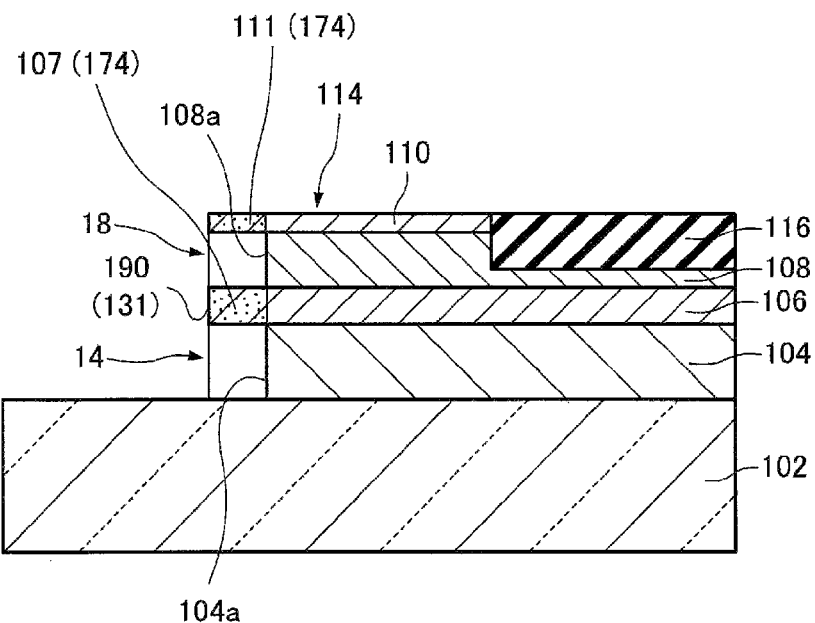
FIG. 13 is a sectional view schematically showing a manufacturing process of the light emitting device according to the embodiment.

As shown in FIG. 13, the projecting parts 107 of the active layer 106 are formed by etching of the first cladding layer 104 and the second cladding layer 108. At the process, the reflection parts 190, 192 are placed outside of the outer edges of the cladding layers 104, 108 in the plan view. Further, at the process, the projecting part 111 of the contact layer 110 may be formed. Furthermore, at the process, part or all of the parts of the cladding layers 104, 108 in which the II-group or XII-group element is diffused may be removed.

Specifically, the etching at the process is performed using an $H_3PO_4$ etchant. Here, for example, the active layer 106 includes the GaInP layer and the AlGaInP layer, and the cladding layers 104, 108 are the AlInP layers or the AlGaInP layers having a smaller gallium composition than that of the GaInP layer or the AlGaInP layer forming the active layer 106. The etching rate of the active layer 106 for the $H_3PO_4$ etchant is lower than the etching rate of the cladding layers 104, 108 for the $H_3PO_4$ etchant. Therefore, in the etching process, the opening parts 14, 24 may be formed in the first cladding layer 104 and the opening parts 18, 28 may be formed in the second cladding layer 108. Thereby, the projecting parts 107 of the active layer 106 may be formed and the reflection parts 190, 192 may be placed outside of the outer edges of the cladding layers 104, 108 in the plan view.

Note that the projecting parts 107 of the active layer 106 and the projecting part 111 of the contact layer 110 may be formed by the diffusion region 174 in which the II-group or XII-group element is diffused as shown in FIG. 13.

Figure 14:
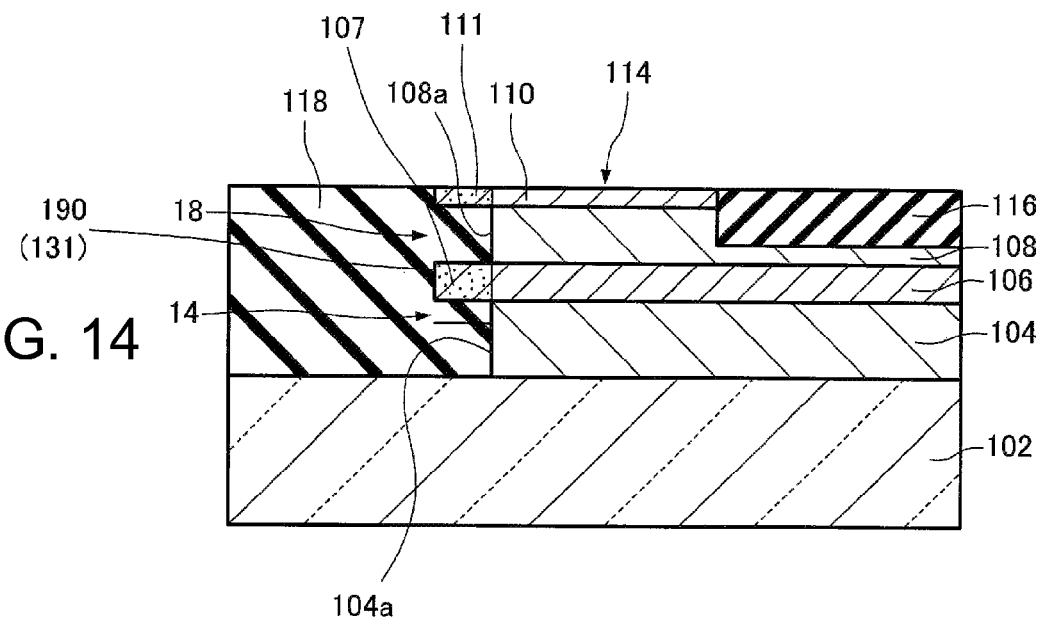
FIG. 14 is a sectional view schematically showing a manufacturing process of the light emitting device according to the embodiment.

As shown in FIG. 14, the low-refractive-index layer 118 is formed to cover the first reflection part 190. The low-refractive-index layer 118 is formed by oblique evaporation or CVD, for example. At the process, the second reflection part 192 may be covered by the low-refractive-index layer 118. Note that the low-refractive-index layer 118 may be formed by curing or firing as necessary after deposition by CVD.

As shown in FIG. 3, the second electrode 122 is formed on the contact layer 110. The second electrode 122 is formed by vacuum evaporation, for example. The second electrode 122 may be formed by patterning a resist mask having a predetermined shape and depositing an electrode layer, and then, removing the resist mask (liftoff). Then, heat treatment for alloying may be performed.

Then, the first electrode 120 is formed on the lower surface of the substrate 102. The first electrode 120 is formed by vacuum evaporation, for example. Heat treatment for alloying may be performed after the deposition by vacuum evaporation.

Note that the sequence of the formation of the first electrode 120 and the second electrode 122 is not particularly limited. Further, after the electrodes 120, 122 are formed, the side surfaces 132, 134, 135, 136 of the active layer 106 may be exposed by cleaving.

The light emitting device 100 may be manufactured at the above described processes.

According to the method of manufacturing the light emitting device 100, the light emitting device 100 that may suppress the occurrence of COD destruction may be obtained.

3. Modified Examples of Light Emitting Device

3.1. First Modified Example

Figure 15:
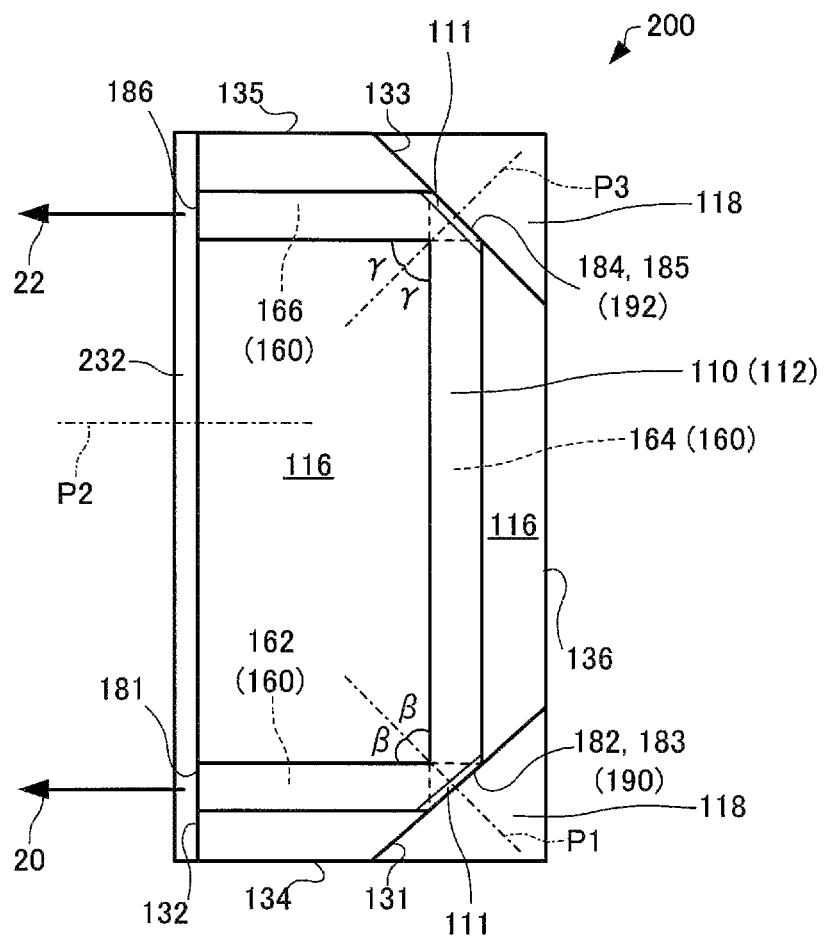
FIG. 15 is a plan view schematically showing a light emitting device according to a first modified example of the embodiment.

Next, a light emitting device according to a first modified example of the embodiment will be explained with reference to the drawings. FIG. 15 is a plan view schematically showing a light emitting device 200 according to the first modified example of the embodiment. Note that, for convenience, the illustration of the second electrode 122 is omitted in FIG. 15.

In the light emitting device 200 according to the first modified example of the embodiment described below, the members having the same functions as those of the component members of the light emitting device 100 have the same signs and their detailed explanation will be omitted. The same applies to light emitting devices 300, 400, 500 according to the modified examples of the embodiment to be described later.

In the light emitting device 100, as shown in FIG. 1, the first section 162 and the third section 166 of the optical waveguide 160 are connected to the second side surface 132 and inclined at the angle α (the angle α is the acute angle larger than 0°) with respect to the perpendicular line P2 of the second side surface 132 in the plan view.

On the other hand, in the light emitting device 200, as shown in FIG. 15, the first section 162 and the third section 166 of the optical waveguide 160 are orthogonal to the second side surface 132 in the plan view. That is, in the light emitting device 200, the extension direction of the first section 162 and the third section 166 is parallel to the perpendicular line P2 of the second side surface 132. That is, the angle α is 0°. Further, in the modified example, both the angle β and the angle γ are 45°, but not limited to that. The first side surface 131 and the third side surface 133 form a right angle so that the angle α may be 0°. Therefore, the angle β and the angle γ are set so that a relationship of γ=90°−β may be satisfied, and thereby, the angle α is 0°.

In the light emitting device 200, the second side surface 132 is covered by an anti-reflection film 232. As the anti-reflection film 232, for example, an $SiO_2$ layer, a $Ta_2O_5$ layer, an $Al_2O_3$ layer, a TiN layer, a $TiO_2$ layer, an SiON layer, an SiN layer, or a multilayer film thereof is used. The anti-reflection film 232 is formed by CVD or sputtering, for example. In the light emitting device 200, the anti-reflection film 232 may reduce direct multiple reflection of the light generated in the optical waveguide 160 between the first end surface 181 and the sixth end surface 186. Accordingly, formation of a direct resonator may be avoided and the laser oscillation of the light generated in the optical waveguide 160 may be suppressed. Therefore, speckle noise may be reduced in the light emitting device 200.

According to the light emitting device 200, the occurrence of COD destruction may be suppressed like the light emitting device 100.

3.2. Second Modified Example

Figure 16:
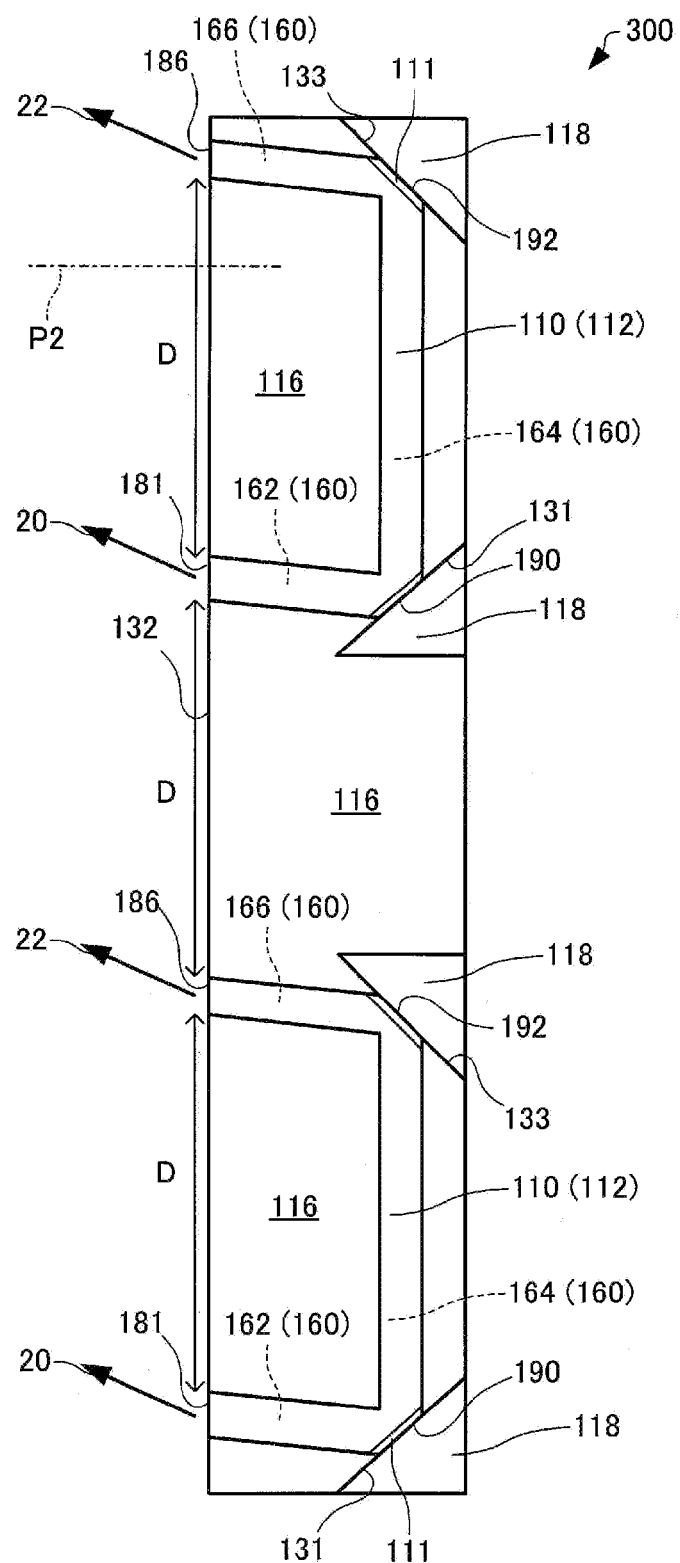
FIG. 16 is a plan view schematically showing a light emitting device according to a second modified example of the embodiment.

Next, a light emitting device according to a second modified example of the embodiment will be explained with reference to the drawings. FIG. 16 is a plan view schematically showing a light emitting device 300 according to the second modified example of the embodiment. Note that, for convenience, the illustration of the second electrode 122 is omitted in FIG. 16.

In the light emitting device 100, as shown in FIG. 2, the single optical waveguide 160 is provided. On the other hand, in the light emitting device 300, as shown in FIG. 16, a plurality of the optical waveguides 160 is provided. In the illustrated example, two optical waveguides 160 are provided, but the number is not particularly limited as long as the number is more than one. The plurality of optical waveguides 160 is arranged in the direction orthogonal to the perpendicular line P2 of the second side surface 132. In the illustrated example, in one optical waveguide 160, the first emitting part 181 and the second emitting part 186 are apart at the distance D, and the first emitting part 181 of one optical waveguide 160 and the second emitting part 186 of the other optical waveguide 160 are apart at the distance D.

According to the light emitting device 300, higher output may be realized compared to the example of the light emitting device 100.

3.3. Third Modified Example

Figure 17:
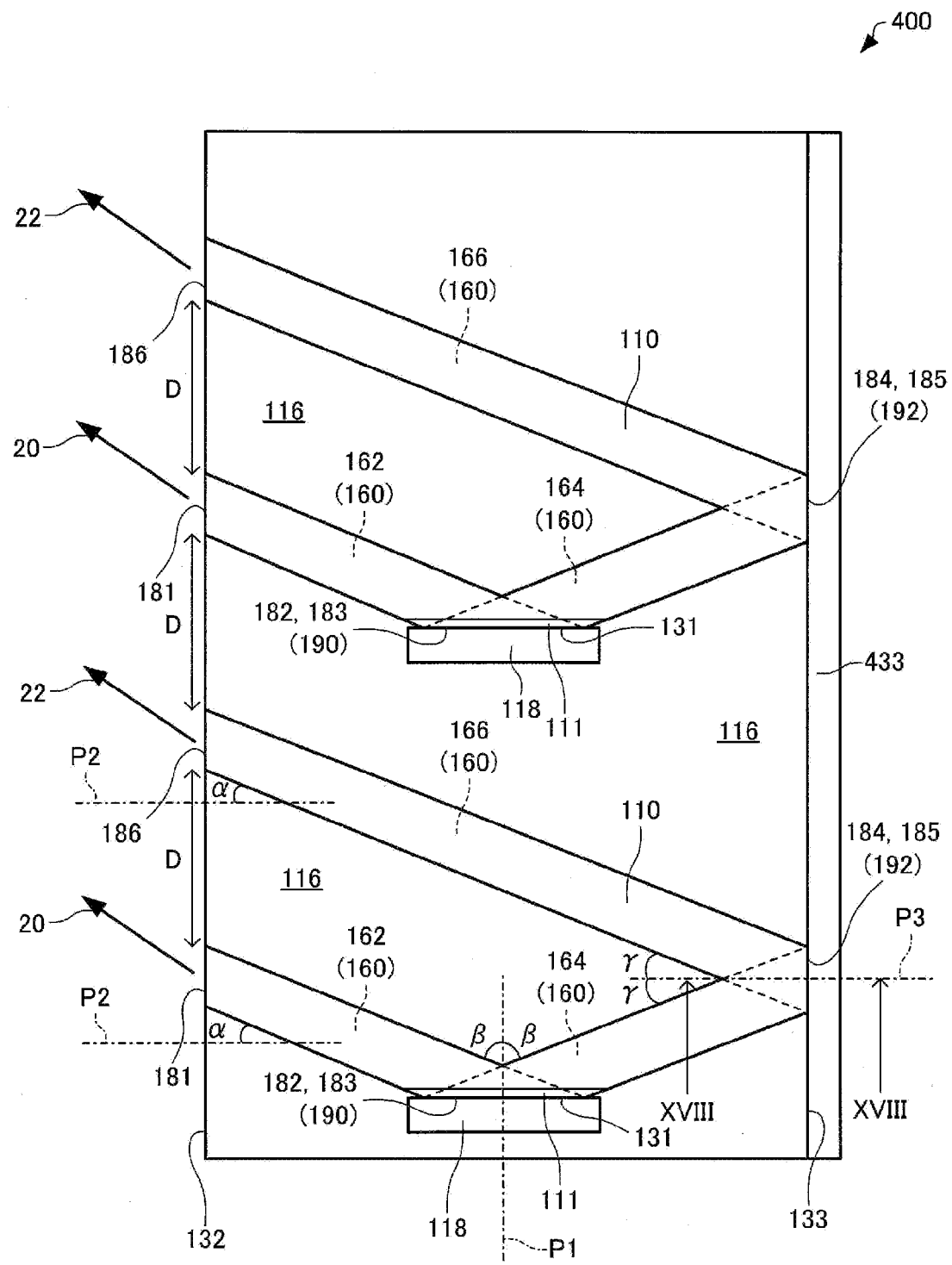
FIG. 17 is a plan view schematically showing a light emitting device according to a third modified example of the embodiment.
Figure 18:
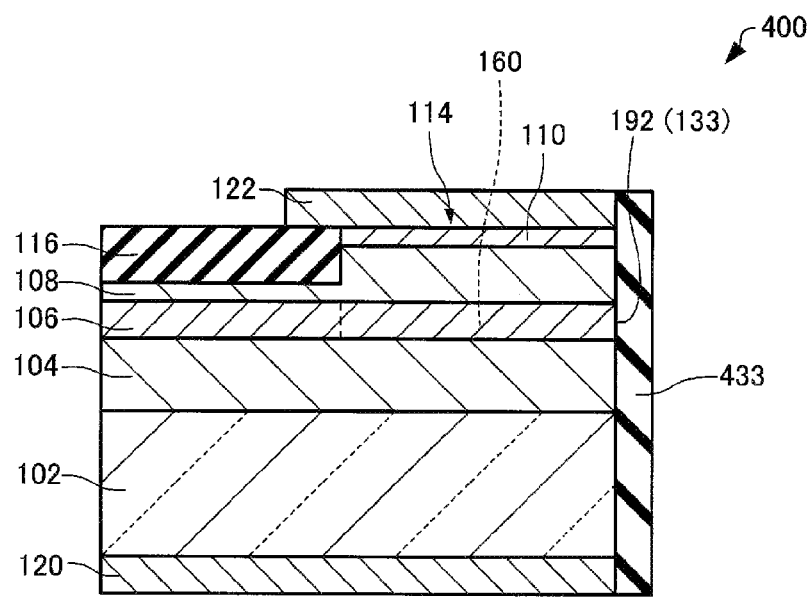
FIG. 18 is a sectional view schematically showing the light emitting device according to the third modified example of the embodiment.

Next, a light emitting device according to a third modified example of the embodiment will be explained with reference to the drawings. FIG. 17 is a plan view schematically showing a light emitting device 400 according to the third modified example of the embodiment. FIG. 18 is a sectional view schematically showing the light emitting device 400 according to the third modified example of the embodiment along XVIII-XVIII line in FIG. 17. Note that, for convenience, the illustration of the second electrode 122 is omitted in FIG. 17. Further, in FIG. 17, the XVIII-XVIII line and the perpendicular line P3 of the third side surface 133 of the active layer 106 are shown by a single line.

In the light emitting device 100, as shown in FIG. 1, the angle β and the angle γ are equal to or more than the critical angle. Further, in the light emitting device 100, the single optical waveguide 160 is provided. On the other hand, in the light emitting device 400, as shown in FIG. 17, the angle β is an angle equal to or larger than the critical angle and the angle γ is an angle smaller than the critical angle. Further, in the light emitting device 400, a plurality of the optical waveguides 160 is provided.

In the light emitting device 400, as shown in FIG. 17, a through hole is formed inside of the outermost edge of the active layer 106, and the side surface defining the through hole of the active layer 106 is the first side surface 131 (first reflection part 190) in the plan view. Further, the first side surface 131 (first reflection part 190) of the active layer 106 is located in the region without the cladding layers 104, 108 in the plan view. Also, in this case, it may be regarded that the first side surface 131 (first reflection part 190) of the active layer 106 is located outside of the regions in which the cladding layers 104, 108 are provided in the plan view.

In the example of the light emitting device 400, as shown in FIG. 18, the third side surface 133 of the active layer 106 is flush with the side surfaces of the cladding layers 104, 108. In this case, the second reflection part 192 is flush with the side surfaces of the cladding layers 104, 108. That is, the second reflection part 192 is not located outside of the outer edges of the cladding layers 104, 108, but overlaps with the outer edges of the cladding layers 104, 108 in the plan view. Any of the II-group or XII-group element may not be diffused in the second reflection part 192. If the II-group or XII-group element is diffused, COD destruction is suppressed by the mutual diffusion of gallium and aluminum as described above, however, the light may not be confined or guided within the guiding layer without the projection parts (flush with the side surfaces). The third side surface 133 forming the second reflection part 192 may be a cleaved surface formed by cleaving. In the example shown in FIG. 17, the third side surface 133 is opposed to the second side surface 132.

The second reflection part 192 is covered by a reflection film 433. In the illustrated example, the third side surface 133 is covered by the reflection film 433. Thereby, the second reflection part 192 may reflect the light generated in the optical waveguide 160. As the reflection film 433, for example, an $SiO_2$ layer, a $Ta_2O_5$ layer, an $Al_2O_3$ layer, a TiN layer, a $TiO_2$ layer, an SiON layer, an SiN layer, an AlON layer, and AlN layer, or a multilayer film thereof is used. The reflection film 433 is formed by CVD or sputtering, for example.

In the example of the light emitting device 400, the plurality of optical waveguides 160 is provided. In the illustrated example, two optical waveguide 160 are provided, but the number is not particularly limited. The plurality of optical waveguides 160 is arranged in the direction orthogonal to the perpendicular line P2 of the second side surface 132. In the illustrated example, in one optical waveguide 160, the first emitting part 181 and the second emitting part 186 are apart at the distance D, and the first emitting part 181 of one optical waveguide 160 and the second emitting part 186 of the other optical waveguide 160 are apart at the distance D.

According to the light emitting device 400, higher output may be realized compared to the example of the light emitting device 100.

4. Projector

Figure 19:
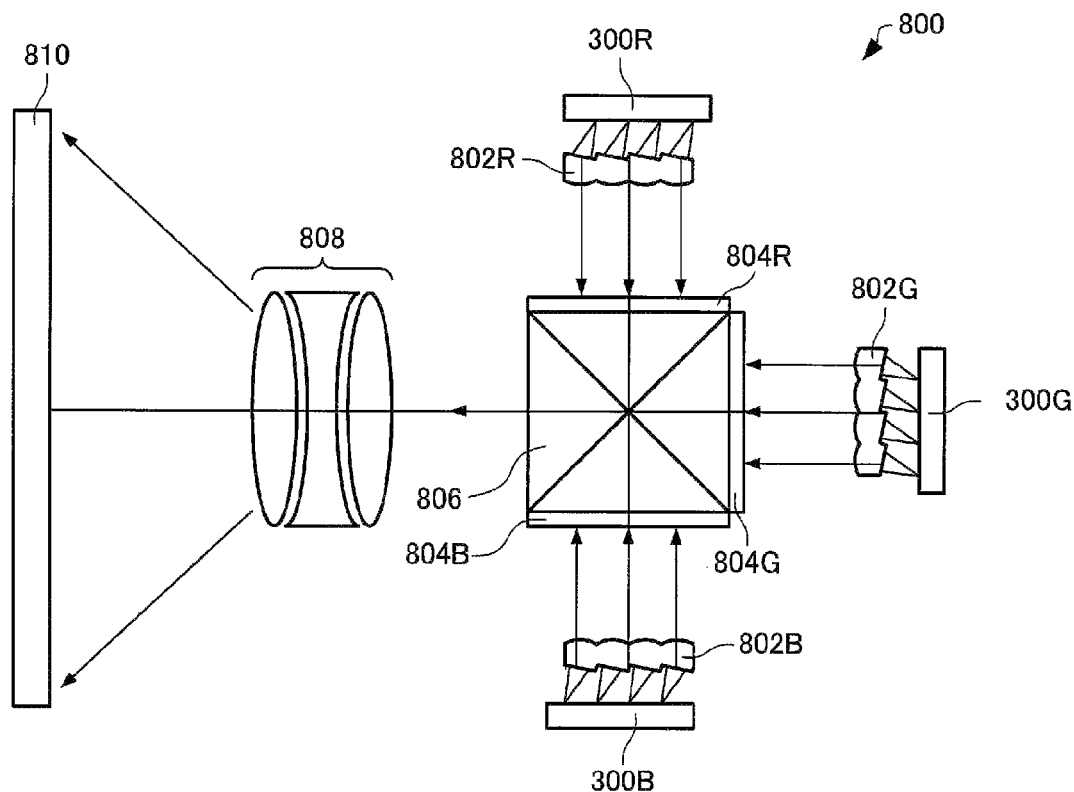
FIG. 19 schematically shows a projector according to the embodiment.
Figure 20:
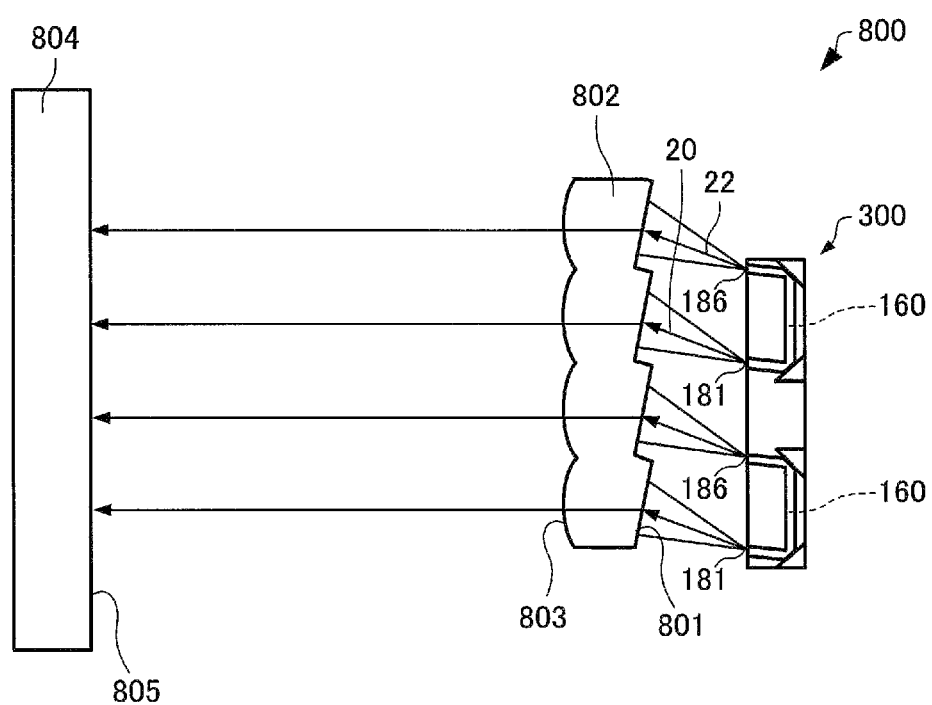
FIG. 20 schematically shows the projector according to the embodiment.

Next, a projector according to the embodiment will be explained with reference to the drawings. FIG. 19 schematically shows a projector 800 according to the embodiment. FIG. 20 schematically shows a part of the projector 800 according to the embodiment. Note that, for convenience, in FIG. 19, a casing forming the projector 800 is omitted and a light source 300 is simplified. Further, in FIG. 20, for convenience, the light source 300, a lens array 802, and a liquid crystal light valve 804 are shown and the light source 300 is simplified.

The projector 800 includes a red light source 300R, a green light source 300G, and a blue light source 300B that emit a red light, a green light, and a blue light as shown in FIGS. 19 and 20. The red light source 300R, the green light source 300G, and the blue light source 300B are the light emitting device according to the invention. Below, the example using the light emitting device 300 as the light emitting devices according to the invention will be explained.

The projector 800 further includes lens arrays 802R, 802G, 802B, transmissive liquid crystal light valves (light modulation devices) 804R, 804G, 804B, and a projection lens (projection device) 808.

The light emitted from the light sources 300R, 300G, 300B enter the respective lens arrays 802R, 802G, 802B. As shown in FIG. 20, the lens array 802 has a flat surface 801 that the light 20, 22 emitted from the emitting parts 181, 186 enter at the light source 300 side. A plurality of the flat surfaces 801 is provided for the pluralities of emitting parts 181, 186 and arranged at equal intervals. The normal (not shown) of the flat surface 801 is inclined with respect to the optical axes of the light 20, 22. Therefore, the optical axes of the light 20, 22 may be made orthogonal to an irradiated surface 805 of the liquid crystal light valve 804 by the flat surface 801.

The lens array 802 has a convex curved surface 803 at the liquid crystal light valve 804 side. A plurality of the convex curved surfaces 803 is provided for the plurality of flat surfaces 801 and arranged at equal intervals. The light 20, 22 with their optical axes converted by the flat surface 801 are focused or their diffusion angles are reduced by the convex curved surfaces 803 and the light is superimposed (partially superimposed). Thereby, the liquid crystal light valve 804 is uniformly irradiated.

As described above, the lens array 802 may control the optical axes and the diffusion angles of the light 20, 22 emitted from the light source 300.

As shown in FIG. 19, the light with their diffusion angles reduced by the respective lens arrays 802R, 802G, 802B enter the respective liquid crystal light valves 804R, 804G, 804B. The respective liquid crystal light valves 804R, 804G, 804B modulate the incident light in response to image information. Then, the projection lens 808 enlarges and projects the image formed by the liquid crystal light valves 804R, 804G, 804B on a screen (display surface) 810.

Further, the projector 800 may include a cross dichroic prism (color combining means) 806 that combines the light emitted from the liquid crystal light valves 804R, 804G, 804B to the projection lens 808.

The three color lights modulated by the respective liquid crystal light valves 804R, 804G, 804B enter the cross dichroic prism 806. The prism is formed by bonding four right angle prisms, and a dielectric multilayer film for reflecting red light and a dielectric multilayer film for reflecting blue light are provided in a cross form. These dielectric multilayer films combine the three color lights and a light representing a color image is formed. Then, the combined light is projected on the screen 810 by the projection lens 808 as a projection system, and the enlarged image is displayed.

According to the projector 800, the light emitting device 300 that can suppress the occurrence of COD destruction may be provided.

According to the projector 800, the distance D between the emitting parts 181, 186 may be adjusted by adjusting the length of the second section 164 without increasing the length in the direction orthogonal to the extension direction of the second section 164 of the optical waveguide 160 (see FIG. 16). Thereby, the distance D between the emitting parts 181, 186 may easily be adjusted according to an interval of the lens array 802. Therefore, in the projector 800, alignment of the lens array may be easier and the liquid crystal light valve 804 may uniformly be irradiated.

According to the projector 800, because of the system of providing the light source 300 immediately below the liquid crystal light valve 804 and performing focusing and uniform illumination at the same time using the lens array 802 (backlight system), the loss reduction of the optical system and the reduction of the number of optical components may be realized.

Note that, in the above described examples, the transmissive liquid crystal light valves are used as the light modulation devices, however, light valves other than those of liquid crystal may be used or reflective light valves may be used. As the light valve, for example, a reflective liquid crystal light valve and a digital micromirror device may be employed. Further, the configuration of the projection system may appropriately be changed depending on the types of the light valves for use.

Further, the light source 300 may be applied to a light source device for a scanning image display device (projector) that displays an image in a desired size on the screen by scanning light from the light source 300.

The above described embodiments and modified examples are just examples and the invention is not limited to those. For example, the respective embodiments and the respective modified examples may appropriately be combined.

The invention includes substantially the same configurations (for example, the configurations having the same functions, methods, and results, or the configurations having the same purposes and effects) as the configurations explained in the embodiments. Further, the invention includes the configurations in which non-essential parts of the configurations explained in the embodiments are replaced. Furthermore, the invention includes the configurations that may exert the same effects or the configurations that may achieve the same purposes as those of the configurations explained in the embodiments. In addition, the invention includes the configurations in which known technologies are added to the configurations explained in the embodiments.

The entire disclosure of Japanese Patent Application No. 2013-008094 filed Jan. 21, 2013 is expressly incorporated by reference herein.

What is claimed is:

1. A light emitting device, comprising:
an active layer having a top active layer surface, a bottom active layer surface and a first active layer side surface, the first active layer side surface being continuously formed from edges of the top and bottom active layer surfaces;
a first cladding layer that is formed on the bottom active layer surface, the first cladding layer having a first cladding layer side surface;
a second cladding layer that is formed on the top active layer surface so that the active layer is sandwiched by the first and second cladding layers, the second cladding layer having a second cladding layer side surface;
a first reflection part provided on the first active layer side surface of the active layer; and
a low-reflective-index layer that is provided directly adjacent to the active layer, the first and second cladding layers, and the first reflection part,
wherein the active layer forms an optical waveguide that guides light,
in the optical waveguide, a traveling direction of the light guided in the optical waveguide changes at the first reflection part,
the first reflection part is located outside of a region in which the first cladding layer and the second cladding layer are provided in a plan view,
the first active layer side surface of the active layer at the first reflection part extends from the first and second cladding layer side surfaces of the first and second cladding layers so that a projecting part of the active layer is laterally shifted from a stacked part of the first and second cladding layers in a plan view, and
the low-reflective-index layer completely covers the first and second cladding layer side surfaces, the projecting part and the first reflection part.

2. The light emitting device according to claim 1, wherein a II-group or XII-group element is diffused in the first reflection part.

3. A projector comprising:
the light emitting device according to claim 2;
a light modulation device that modulates the light emitted from the light emitting device in response to image information; and
a projection device that projects an image formed by the light modulation device.

4. The light emitting device according to claim 1, wherein the optical waveguide comprises:
a first section having a strip shape connecting a first emitting part provided on a second active layer side surface of the active layer and the first reflection part;
a second section having a strip shape connecting the first reflection part and a second reflection part provided on a third active layer side surface of the active layer; and
a third section having a strip shape connecting the second reflection part and a second emitting part provided on the second active layer side surface.

5. The light emitting device according to claim 4, wherein, in a plan view,
the first section and the second section are both inclined at a first angle with respect to a perpendicular of the first active layer side surface and extend from the first reflection part,
the second section and the third section are both inclined at a second angle with respect to a perpendicular of the third active layer side surface and extend from the second reflection part, and
the first angle and the second angle are equal to or larger than a critical angle.

6. A projector comprising:
the light emitting device according to claim 5;
a light modulation device that modulates the light emitted from the light emitting device in response to image information; and
a projection device that projects an image formed by the light modulation device.

7. The light emitting device according to claim 4, wherein, in a plan view,
the first section is inclined with respect to a perpendicular of the second active layer side surface and extends from the first emitting part, and
the third section is inclined with respect to the perpendicular of the second active layer side surface and extends from the second emitting part.

8. A projector comprising:
the light emitting device according to claim 7;
a light modulation device that modulates the light emitted from the light emitting device in response to image information; and
a projection device that projects an image formed by the light modulation device.

9. A projector comprising:
the light emitting device according to claim 4;
a light modulation device that modulates the light emitted from the light emitting device in response to image information; and
a projection device that projects an image formed by the light modulation device.

10. The light emitting device according to claim 1, wherein the active layer includes a GaInP layer and an AlGaInP layer, and
the first cladding layer and the second cladding layer are at least one of AlInP layers or AlGaInP layers having a smaller gallium composition than that of the GaInP layer or the AlGaInP layer forming the active layer.

11. A projector comprising:
the light emitting device according to claim 10;
a light modulation device that modulates the light emitted from the light emitting device in response to image information; and
a projection device that projects an image formed by the light modulation device.

12. The light emitting device according to claim 1, wherein the first active layer side surface is an etched surface.

13. A projector comprising:
the light emitting device according to claim 12;
a light modulation device that modulates the light emitted from the light emitting device in response to image information; and
a projection device that projects an image formed by the light modulation device.

14. The light emitting device according to claim 1, wherein the low-refractive-index layer has a lower refractive index than that of the active layer.

15. A projector comprising:
the light emitting device according to claim 14;
a light modulation device that modulates the light emitted from the light emitting device in response to image information; and
a projection device that projects an image formed by the light modulation device.

16. A projector comprising:
the light emitting device according to claim 1;
a light modulation device that modulates the light emitted from the light emitting device in response to image information; and
a projection device that projects an image formed by the light modulation device.

17. The light emitting device according to claim 1, wherein the light emitting device is a superluminescent diode.

18. A light emitting device, comprising:
an active layer sandwiched between a first cladding layer and a second cladding layer;
a first reflection part provided on a first side surface of the active layer;
a first emitting part provided at a first position on a second side surface of the active layer;
a second emitting part provided at a second position on the second side surface of the active layer;
a second reflection part provided on a third side surface of the active layer;
a first low-reflective-index layer that is provided directly adjacent to the active layer, the first and second cladding layers, and the first reflection part; and
a second low-reflective-index layer that is provided directly adjacent to the active layer, the first and second cladding layers, and the second reflection part, wherein
the active layer forms an optical waveguide that guides light, the optical waveguide including:
a first section having a strip shape and extending from the first emitting part to the first reflection part;
a second section having a strip shape and extending from the first reflection part to the second reflection part; and
a third section having a strip shape and extending from the second reflection part to the second emitting part,
the first and second reflection parts are located outside of a region in which the first cladding layer and the second cladding layer are provided in a plan view,
an end of the active layer at the first reflective part extends from first ends of the first and second cladding layers so that a first projecting part of the active layer is laterally shifted from a stacked part of the first and second cladding layers in the plan view,
an end of the active layer at the second reflection cart extends from second ends of the first and second cladding layers so that a second projecting part of the active layer is laterally shifted from the stacked part of the first and second cladding layers in the plan view,
the first low-reflective-index layer completely covers the first ends of the first and second cladding layers, the first protecting part and the first reflecting part, and
the second low-reflective-index layer completely covers the second ends of the first and second cladding layers, the second projecting part and the second reflection part.

19. The light emitting device according to claim 18, wherein, in the plan view,
the first section and the second section are both inclined at a first angle with respect to a perpendicular of the first side surface,
the second section and the third section are both inclined at a second angle with respect to a perpendicular of the third side surface.

20. The light emitting device according to claim 18, wherein, in the plan view,
the first section is inclined with respect to a perpendicular of the second side surface, and
the third section is inclined with respect to the perpendicular of the second side surface.

* * * * *